(12) United States Patent
Kang et al.

(10) Patent No.: US 12,148,475 B2
(45) Date of Patent: Nov. 19, 2024

(54) SELECTION GATE SEPARATION FOR 3D NAND

(71) Applicant: Applied Materials, Inc., Santa Clara, CA (US)

(72) Inventors: Chang Seok Kang, Santa Clara, CA (US); Tomohiko Kitajima, San Jose, CA (US); Gill Yong Lee, San Jose, CA (US); Qian Fu, Pleasanton, CA (US); Sung-Kwan Kang, Santa Clara, CA (US); Takehito Koshizawa, San Jose, CA (US); Fredrick Fishburn, Aptos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 471 days.

(21) Appl. No.: 17/705,744

(22) Filed: Mar. 28, 2022

(65) Prior Publication Data

US 2022/0319601 A1 Oct. 6, 2022

Related U.S. Application Data

(60) Provisional application No. 63/169,380, filed on Apr. 1, 2021.

(51) Int. Cl.
*G11C 16/04* (2006.01)
*H10B 41/27* (2023.01)
(Continued)

(52) U.S. Cl.
CPC ......... *G11C 16/0483* (2013.01); *H10B 41/27* (2023.02); *H10B 41/35* (2023.02); *H10B 43/27* (2023.02); *H10B 43/35* (2023.02)

(58) Field of Classification Search
CPC .... G11C 16/0483; H10B 41/35; H10B 43/35; H10B 43/40; H10B 43/50;
(Continued)

(56) References Cited

U.S. PATENT DOCUMENTS 7,554,846 B2 6/2009 Helm
8,300,466 B2 10/2012 Maejima
(Continued)

FOREIGN PATENT DOCUMENTS

TW 201921639 A 6/2019
TW I686922 B 3/2020
(Continued)

OTHER PUBLICATIONS

PCT International Search Report and Written Opinion in PCT/US2022/022421 dated Jul. 22, 2022, 8 pages.

*Primary Examiner* — Jonathan Han
(74) *Attorney, Agent, or Firm* — Servilla Whitney LLC

(57) ABSTRACT

Described is a memory string including at least one select gate for drain (SGD) transistor and at least one memory transistor in a vertical hole extending through a memory stack on a substrate. The memory stack comprises alternating word lines and dielectric material. There is at least one select-gate-for-drain (SGD) transistor in a first vertical hole extending through the memory stack, the select-gate-for-drain (SGD) transistor comprising a first gate material. At least one memory transistor is in a second vertical hole extending through the memory stack, the at least one memory transistor comprising a second gate material different from the first gate material.

20 Claims, 24 Drawing Sheets

(51) Int. Cl.
*H10B 41/35* (2023.01)
*H10B 43/27* (2023.01)
*H10B 43/35* (2023.01)

(58) Field of Classification Search
CPC .............. H10B 20/40–65; H10B 53/20; H10B 41/20–27; H10B 43/20–27; H10B 51/20; H10B 63/84–845; H01L 29/42392
See application file for complete search history.

(56) References Cited

U.S. PATENT DOCUMENTS

| | | | |
|---|---|---|---|
| 9,960,045 | B1 | 5/2018 | Purayath |
| 10,319,739 | B2 | 6/2019 | Purayath |
| 10,325,923 | B2 | 6/2019 | Purayath |
| 10,354,916 | B2 | 6/2019 | Chen et al. |
| 10,410,869 | B2 | 9/2019 | Roy et al. |
| 10,468,259 | B2 | 11/2019 | Purayath et al. |
| 10,529,737 | B2 | 1/2020 | Purayath |
| 10,541,246 | B2 | 1/2020 | Purayath |
| 10,553,604 | B2 | 2/2020 | Lu et al. |
| 10,622,251 | B2 | 4/2020 | Chen et al. |
| 10,644,105 | B2 | 5/2020 | Carlson |
| 10,790,298 | B2 | 9/2020 | Purayath |
| 10,886,172 | B2 | 1/2021 | Chen |
| 10,964,717 | B2 | 3/2021 | Kang et al. |
| 10,998,329 | B2 | 5/2021 | Koshizawa et al. |
| 11,024,371 | B2 | 6/2021 | Cui et al. |
| 11,049,695 | B2 | 6/2021 | Kang et al. |
| 2007/0042548 | A1 | 2/2007 | Noh et al. |
| 2014/0175530 | A1 | 6/2014 | Chien et al. |
| 2015/0123189 | A1 | 5/2015 | Sun et al. |
| 2017/0069637 | A1 | 3/2017 | Son et al. |
| 2017/0236896 | A1 | 8/2017 | Lu et al. |
| 2017/0278864 | A1 | 9/2017 | Hu et al. |
| 2018/0090307 | A1 | 3/2018 | Brunner et al. |
| 2018/0144977 | A1 | 5/2018 | Yu et al. |
| 2018/0330985 | A1 | 11/2018 | Yu et al. |
| 2019/0393042 | A1 | 12/2019 | Roy et al. |
| 2020/0020719 | A1 | 1/2020 | Choi |
| 2020/0051994 | A1 | 2/2020 | Purayath et al. |
| 2020/0111809 | A1 | 4/2020 | Kawaguchi et al. |
| 2020/0118822 | A1 | 4/2020 | Falk et al. |
| 2020/0185408 | A1* | 6/2020 | Song ..................... H10B 43/10 |
| 2020/0203373 | A1 | 6/2020 | Kang et al. |
| 2020/0266211 | A1 | 8/2020 | Tao et al. |
| 2020/0312874 | A1 | 10/2020 | Kang et al. |
| 2020/0350014 | A1 | 11/2020 | Liu |
| 2020/0350287 | A1 | 11/2020 | Liu |
| 2020/0395375 | A1 | 12/2020 | Huo et al. |
| 2020/0402562 | A1 | 12/2020 | Li et al. |
| 2020/0411509 | A1 | 12/2020 | Yang et al. |
| 2021/0043643 | A1* | 2/2021 | Lu ..................... H01L 21/76895 |
| 2021/0126005 | A1 | 4/2021 | Lu et al. |
| 2021/0210142 | A1 | 7/2021 | Liu |
| 2021/0217773 | A1 | 7/2021 | Kang et al. |
| 2021/0225865 | A1 | 7/2021 | Wu |
| 2021/0233779 | A1 | 7/2021 | Kang et al. |
| 2021/0233918 | A1 | 7/2021 | Koshizawa et al. |
| 2021/0249436 | A1 | 8/2021 | Ding et al. |
| 2021/0257375 | A1 | 8/2021 | Koshizawa et al. |
| 2021/0257385 | A1 | 8/2021 | Hu et al. |
| 2021/0257386 | A1 | 8/2021 | Wang et al. |
| 2021/0257387 | A1 | 8/2021 | Huang et al. |

FOREIGN PATENT DOCUMENTS

| | | |
|---|---|---|
| WO | 2014165461 A4 | 10/2014 |
| WO | 2018/195423 A1 | 10/2018 |
| WO | 2019055075 A1 | 3/2019 |

* cited by examiner

SELECTION GATE SEPARATION FOR 3D NAND

CROSS-REFERENCE TO RELATED APPLICATIONS

This application claims priority to U.S. Provisional Application No. 63/169,380, filed Apr. 1, 2021, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide 3D-NAND select-gate-for-drain (SGD) transistor and methods for forming.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Current 3D-NAND devices, which have a memory stack comprising alternating layers of an oxide material and a nitride material, have multiple memory holes between two slits. For the access to each cell by a word line and bit line, the memory holes between slits needs to be divided by select gate at drain (SGD) cut. For example, Toshiba 96L stacked 3D NAND with 8 memory holes and one dummy hole has one SGD cut separates the holes into two groups. In order to reduce the array size of 3D-NAND, the number of holes between slits (nHole) needs to be increased. If nHole increases more than 8 holes, there needs to be more than one SGD cut for the same technology. The holes under the same bit line level should be separately accessible by a combination of bit line (BL) and word line (WL). In other words, holes under same bit line are selected independently by a select gate for drain (SGD) and bit line. For this purpose, SGDs between slits should be separated by an SGD-cut. When the number of holes between slits (nHole) is small, e.g., 8, one SGD-cut separate select gate for drains (SGDs). However, when the number of holes between slits (nHole) is large, e.g., 12), SGD-cut needs to be added for every four holes.

Accordingly, there is a need in the art for 3D-NAND devices and methods of fabricating 3D-NAND devices having a select gate for drain (SGD) cut.

SUMMARY

One or more embodiments of the disclosure are directed to a semiconductor memory device. In one or more embodiments, a semiconductor memory device comprises: at least one select-gate-for-drain (SGD) on a memory stack on a substrate, the memory stack comprising alternating word line and dielectric material; at least one select-gate-for-drain (SGD) transistor in a first vertical hole extending through the memory stack, the select-gate-for-drain (SGD) transistor comprising a first gate material; and at least one memory transistor in a second vertical hole extending through the memory stack, the at least one memory transistor comprising a second gate material different from the first gate material.

Other embodiments of the disclosure are directed to a semiconductor memory device. In one or more embodiments, a semiconductor memory device comprises: at least one select-gate-for-drain (SGD) on a memory stack on a substrate, the memory stack comprising alternating word line and dielectric material; a vertical string extending through the memory stack, the vertical string comprising at least one SGD transistor and at least one memory transistor; a bit line pad on a top surface of the vertical string, the bit line pad having a first size; a self-aligned mask layer on a top surface of the bit line pad, the self-aligned mask layer having a second size, the second size from 1 nm to 50 nm larger than the first size.

Additional embodiments of the disclosure are directed to a method of forming a semiconductor device. In one or more embodiments, a method of forming a semiconductor device having a three-dimensional vertical memory string including a select gate for drain (SGD) transistor and a memory transistor comprises: forming a select-gate-for-drain (SGD) gate on a top surface of memory stack, the memory stack comprising alternating layers of a first layer and a second layer on a substrate; forming a memory string, the memory string extending through the select-gate-for-drain (SGD) gate and the memory stack; forming a bit line pad on a top surface of the memory string; forming a self-aligned mask on a top surface of the bit line pad; forming a first opening in the select-gate-for-drain (SGD) gate; filling the first opening with a dielectric material; forming a slit extending from a top surface of the select-gate-for-drain (SGD) gate through the memory stack to the substrate; removing the first layer to form a second opening; and forming a word line in the second opening.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
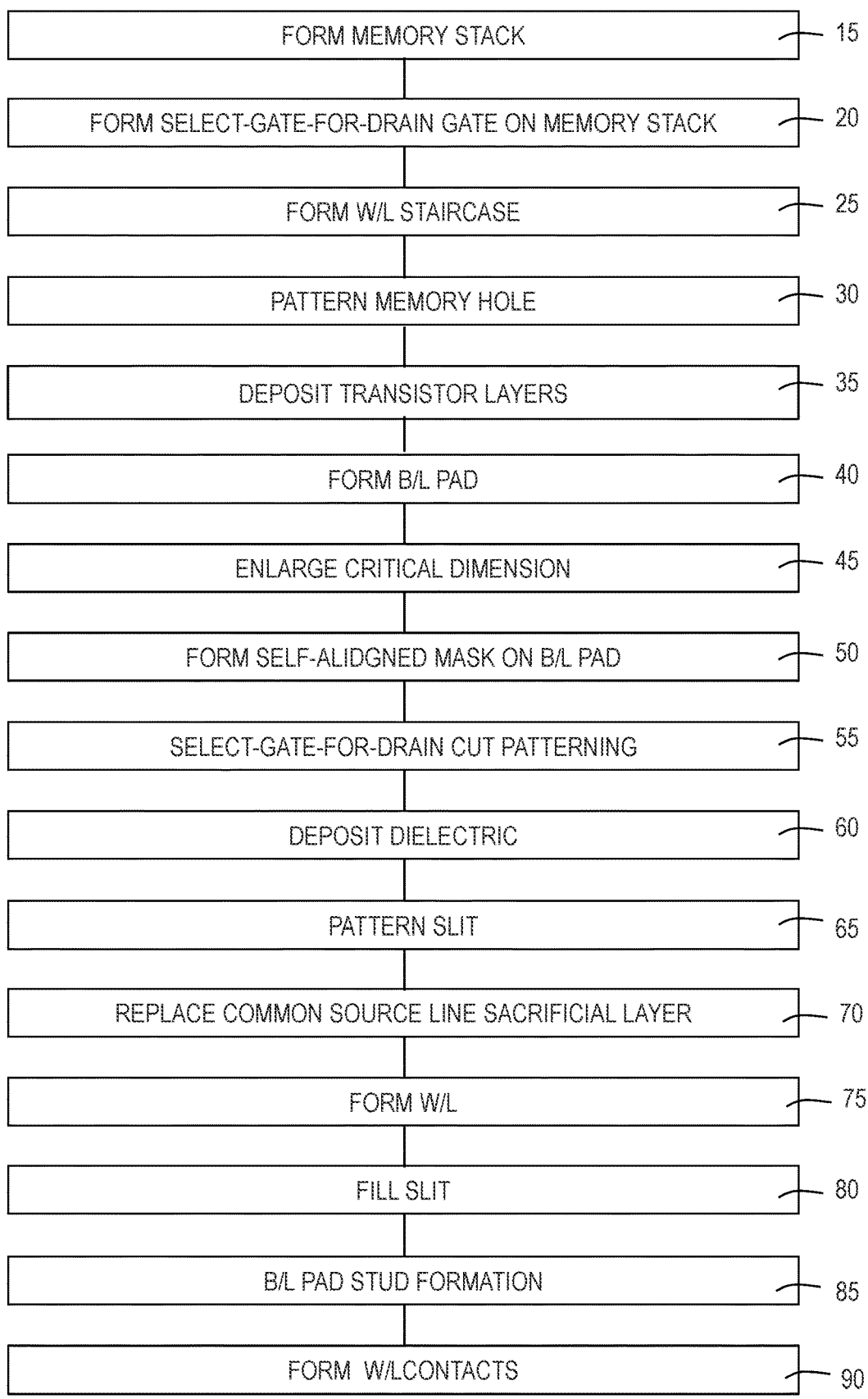
FIG. 1 illustrates a process flow diagram of a method of forming a memory device according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor," "reactant," "reactive gas" and the like are used interchangeably to refer to any gaseous species that can react with the substrate surface.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

In existing 3D NAND devices based on a memory stack of alternating layers of an oxide material and a nitride material, a select-gate-for-drain (SGD) cut cannot be formed using current integration schemes, e.g., select-gate-for-drain before word line replacement when there exists more than one SGD-cut. In current integration schemes, the SGD formed before replacement blocks replacement of word lines between SGD-cuts. In order to reduce the array size of 3D-NAND, the number of memory strings (e.g., holes) between slits (nHole) needs to be increased. The holes under the same bit line level should be separately accessible by a combination of bit line (BL) and word line (WL). In other words, holes under same bit line are selected independently by a select gate for drain (SGD) and bit line. For this purpose, SGDs between slits should be separated by an SGD-cut. When the number of holes between slits (nHole) is small, e.g., ≤8, one SGD-cut separate select gate for drains (SGDs). However, when the number of holes between slits (nHole) is large, e.g., ≥12, SGD-cut needs to be added for every four holes. Accordingly, one or more embodiments provide 3D NAND structures and method of fabricating select-gate-for-drain cuts using a non-replacement gate integration scheme.

Existing 3D NAND devises, which use a WL-replacement scheme, cannot meet the SGD-cut requirement for nHoles (≥12). The SGD-cut region formed before WL replacement blocks removal of the silicon nitride (SiN) sacrificial layer. Thus, SGD transistors located between SGD-cuts cannot work as a transistor due to the lack of WL.

One or more embodiments provide structures and methods for fabricating a select-gate-for-drain (SGD) transistor by non-replacement WL while transistors other than select-gate-for-drain (SGD) transistors are formed by non-replacement. In addition, SGD-cut is formed without dummy holes, and, thus, cell is enhanced.

The device and fabrication method of one or more embodiments advantageously permit select-gate-for-drain cut without dummy holes, thus increase the cell density.

In one or more embodiments, metal deposition and other processes can be carried out in an isolated environment (e.g., a cluster process tool). Accordingly, some embodiments of the disclosure provide integrated tool systems with related process modules to implement the methods.

FIG. 1 illustrates a flowchart for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, a select-gate-for-drain gate is formed on the memory stack. At operation 25, a word line staircase is formed in the memory stack. At operation 30, a memory hole is patterned. At operation 35, transistor layers are deposited in the memory hole. At operation 40, the bit line pad is formed. At operation 45, the critical dimensions of the bit line pad are increased. At operation 50, a self-aligned mask is formed on the bit line pad. At operation 55, a select-gate-for-drain cut is made. At operation 60, a dielectric layer is deposited in the opened formed by the select-gate-for-drain cut. At operation 65, the device is slit patterned. At operation 70, the sacrificial layer of the common source line is removed and replaced. At operation, 75, the word line is formed. At operation 80, the slit is filled with a dielectric material. At operation 85, the bit line pad studs are formed. At operation 90, back-end-of-the-line (BEOL) contacts are formed.

FIGS. 2-21 illustrate a portion of a memory device 100 following the process flow illustrated for the method 10 in FIG. 1.

Figure 2:
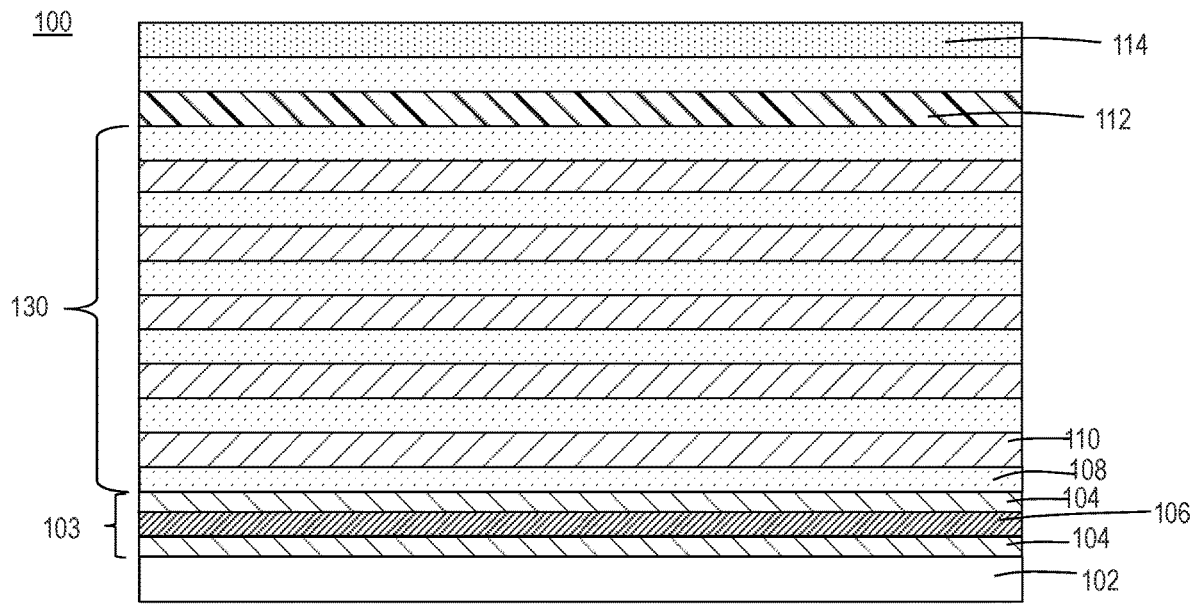
FIG. 2 illustrates a cross-sectional view of an electronic device with a memory stack according to one or more embodiments.

FIG. 2 illustrates an initial or starting memory stack of an electronic device 100 in accordance with one or more embodiments of the disclosure. In some embodiments, the electronic device 100 shown in FIG. 2 is formed on the bare substrate 102 in layers, as illustrated. The electronic device of FIG. 2 is made up of a substrate 102, a common source line 103, and a memory stack 130.

The substrate 102 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, a common source line 103 is on the substrate 102. The common source line 103 may also be referred to as the semiconductor layers. The common source line 103 can be formed by any suitable technique known to the skilled artisan and can be made from any suitable material including, but not limited to, poly-silicon (poly-Si). In some embodiments, the common source line 103 comprises several different conductive or a semiconductor material. For example, in one or more embodiments, as illustrated in FIG. 2, the common source line 103 comprises a poly-silicon layer 104 on the substrate 102, a sacrificial layer 106 on the polysilicon layer, and a second polysilicon layer 104 on the sacrificial layer 106.

In one or more embodiments, a sacrificial layer 106 may formed on the polysilicon layer 104 and can be made of any suitable material. The sacrificial layer 106 in some embodiments is removed and replaced in later processes. In some embodiments, the sacrificial layer 106 is not removed and remains within the memory device 100. In this case, the term "sacrificial" has an expanded meaning to include permanent layers and may be referred to as the conductive layer. In the illustrated embodiment, as described further below, the sacrificial layer 106 is removed in operation 70. In one or more embodiments, the sacrificial layer 106 comprises a material that can be removed selectively versus the neighboring polysilicon layer 104. In one or more embodiments, the sacrificial layer comprises a nitride material, e.g., silicon nitride (SiN), or an oxide material, e.g., silicon oxide ($SiO_x$).

In one or more embodiments, a memory stack 130 is formed on the common source line 103. The memory stack 130 in the illustrated embodiment comprises a plurality of alternating first layers 108 and second layers 110. While the memory stack 130, illustrated in FIG. 2, has five pairs of alternating first layers 108 and second layers 110, one of skill in the art recognizes that this is merely for illustrative purposes only. The memory stack 130 may have any number of alternating first layers 108 and second layers 110. For example, in some embodiments, the memory stack 130 comprises 192 pairs of alternating first layers 108 and second layers 110. In other embodiments, the memory stack 130 comprises greater than 50 pairs of alternating first layers 108 and second layers 110, or greater than 100 pairs of alternating first layers 108 and second layers 110, or greater than 300 pairs of alternating first layers 108 and second layers 110.

In one or more embodiments, the first layers 108 and the second layers 110 independently comprise a dielectric material. In one or more embodiments, the dielectric material may comprise any suitable dielectric material known to the skilled artisan. As used herein, the term "dielectric material" refers to an electrical insulator that can be polarized in an electric field. In some embodiments, the dielectric material comprises one or more of oxides, carbon doped oxides, silicon dioxide ($SiO_2$), porous silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH).

In one or more embodiments, the first layers 108 comprise oxide layers and the second layers 110 comprise nitride layers. In one or more embodiments, the second layers 110 comprise a material that is etch selective relative to the first layers 108 so that the second layers 110 can be removed without substantially affecting the first layers 108. In one or more embodiments, the first layers 108 comprise silicon oxide ($SiO_x$). In one or more embodiments, the second layers 110 comprise silicon nitride (SiN). In one or more embodiments first layers 108 and second layers 110 are deposited by chemical vapor deposition (CVD) or physical vapor deposition (PVD).

The individual alternating layers may be formed to any suitable thickness. In some embodiments, the thickness of each second layer 110 is approximately equal. In one or more embodiments, each second layer 110 has a second layer thickness. In some embodiments, the thickness of each first layer 108 is approximately equal. As used in this regard, thicknesses which are approximately equal are within +/−5% of each other. In some embodiments, a silicon layer (not shown) is formed between the second layers 110 and first layers 108. The thickness of the silicon layer may be relatively thin as compared to the thickness of a layer of second layers 110 or first layers 108. In one or more embodiments, the first layers 108 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first layer 108 has a thickness in the range of from about 0.5 to about 40 nm. In one or more embodiments, the second layers 110 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second layer 110 has a thickness in the range of from about 0.5 to about 40 nm.

In one or more embodiments first layers 108 and second layers 110 are deposited by chemical vapor deposition (CVD) or physical vapor deposition (PVD). The individual alternating layers may be formed to any suitable thickness. In some embodiments, the thickness of each second layer 112 is approximately equal. In one or more embodiments, each second layer 112 has a first second layer thickness. In some embodiments, the thickness of each first layer 110 is approximately equal. As used in this regard, thicknesses which are approximately equal are within +/−5% of each other. In one or more embodiments, the first layers 108 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second layers 110 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm.

Referring to FIG. 2, at operation 20 of method 10, a select-gate-for-drain gate material 112 is formed on a top surface of the memory stack 130. In one or more embodiments, the select-gate-for-drain gate material 112 is formed on a top surface of a first layer 108. In one or more embodiments, the select-gate-for-drain gate material 112 comprises one or more of poly-silicon or a metal. The metal may comprise any suitable metal known to the skilled artisan. In some embodiments, the metal is a refractory metal. In one or more embodiments, the metal may be selected from one or more of tungsten (W), molybdenum (Mo), ruthenium (Ru), iridium (Ir), tantalum (Ta), titanium (Ti), and osmium (Os).

Figure 3:
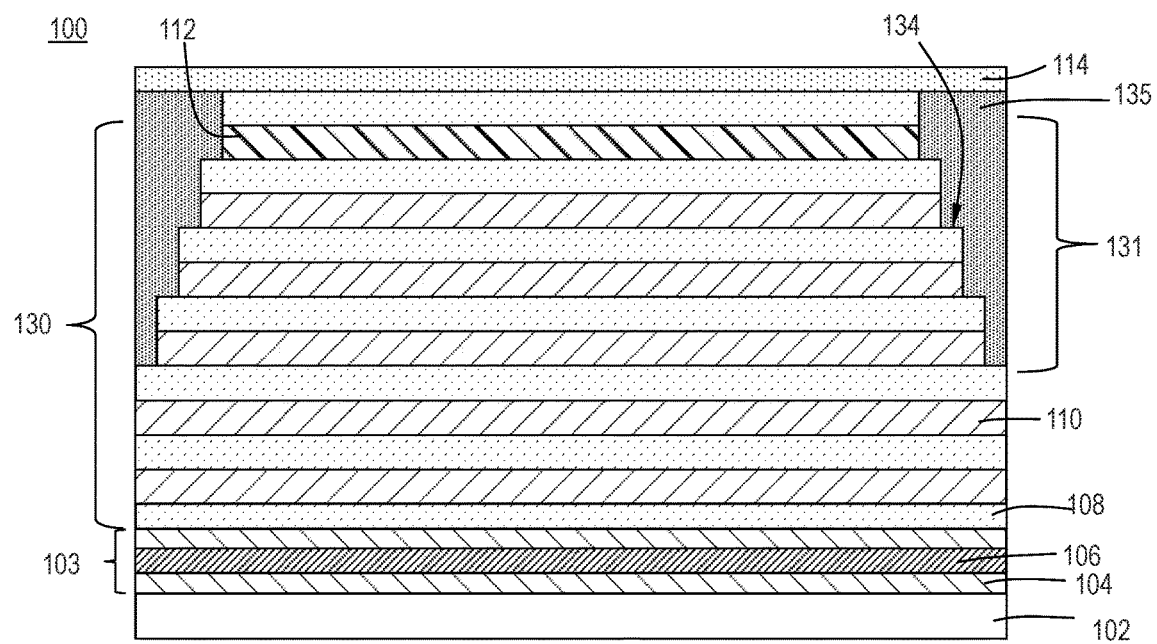
FIG. 3 illustrates a cross-sectional view of an electronic device after forming a staircase pattern of the memory stack according to one or more embodiments.

Referring to FIG. 3, at operation 25 of method 10, a staircase formation 131 is created. A mask layer 114 is deposited on the top surface of the select-gate-for-drain gate material 112. The mask layer 114 may comprise any suitable material known to the skilled artisan. In one or more embodiments the mask layer 114 comprises a nitride.

In one or more embodiments, the staircase formation 131 exposes a top surface 134 of the first layers 108. The top surface 134 can be used to provide space for word line contacts to be formed, as described below. A suitable fill material 135 can be deposited to occupy the space outside the staircase formation 131. A suitable fill material 135, as will be understood by the skilled artisan, can be any material that prevents electrical shorting between adjacent word lines. A staircase formation 131 with each word line having a smaller width (illustrated from left-to-right in the figures) than the word line below. Use of relative terms like "above" and "below" should not be taken as limiting the scope of the disclosure to a physical orientation in space.

It is to be noted that for ease of illustration, the staircase formation 131 is not shown in FIGS. 4-22, but, as recognized by one of skill in the art, the staircase formation 131 is present.

Figure 4:
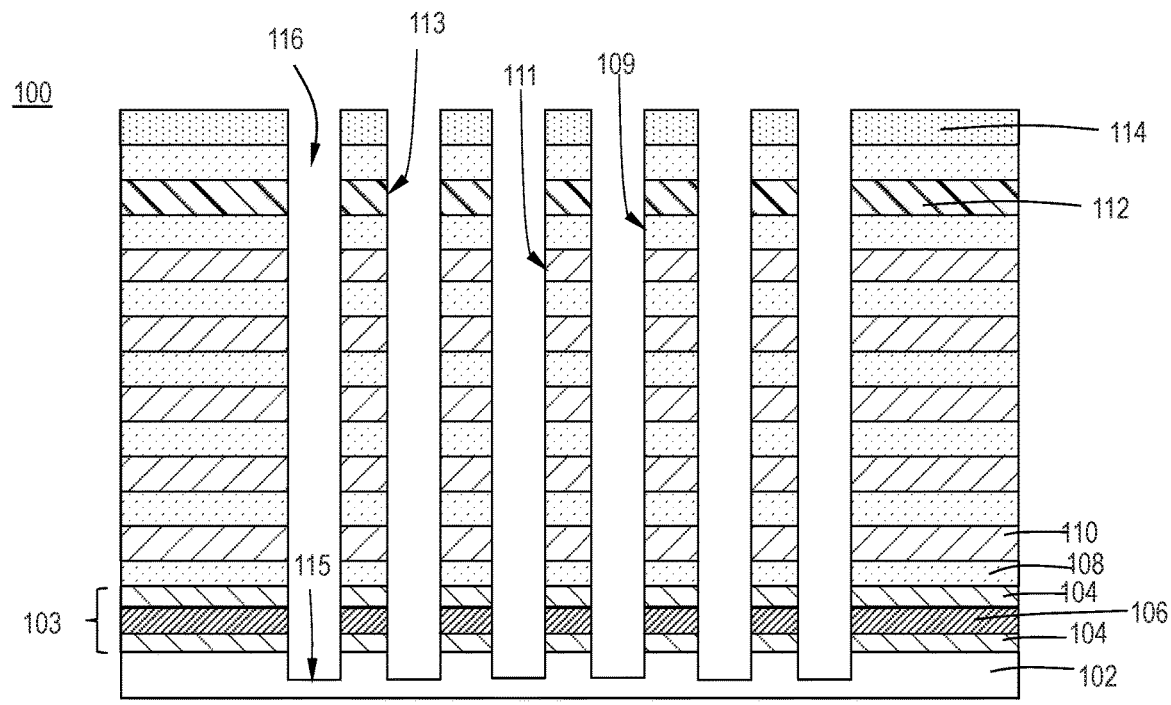
FIG. 4 illustrates a cross-sectional view of an electronic device according to one or more embodiments.
Figure 5A:
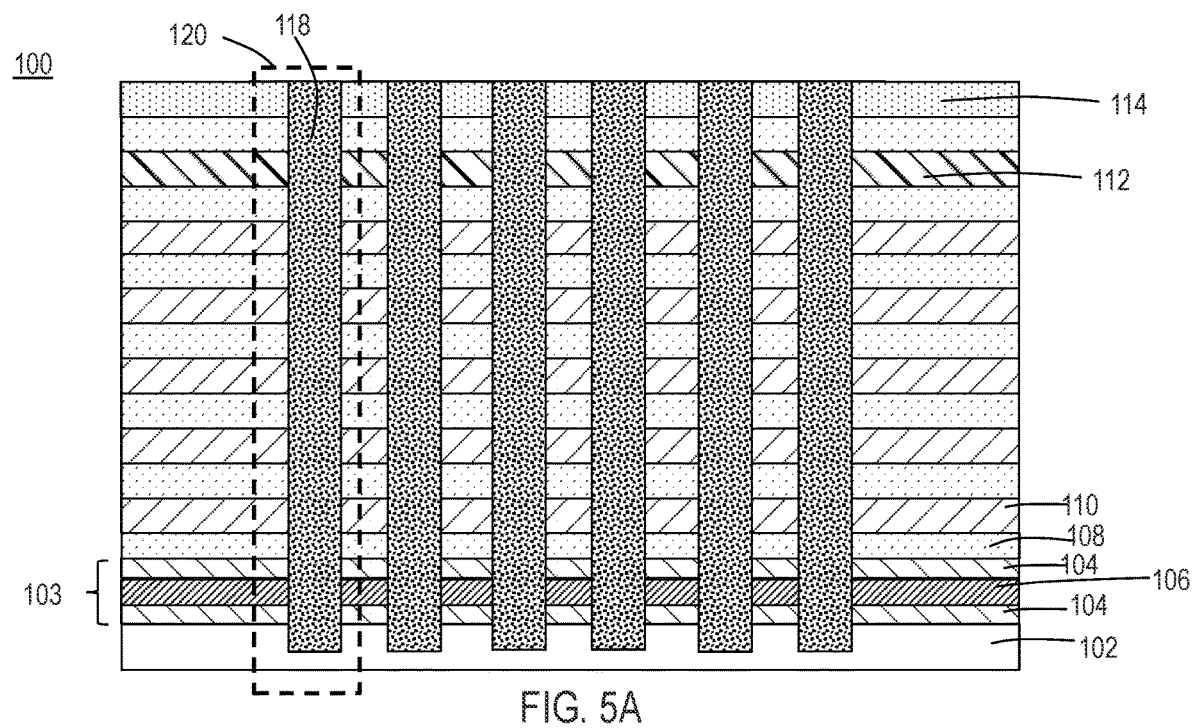
FIG. 5A illustrates a cross-sectional view of an electronic device according to one or more embodiments.
Figure 5B:
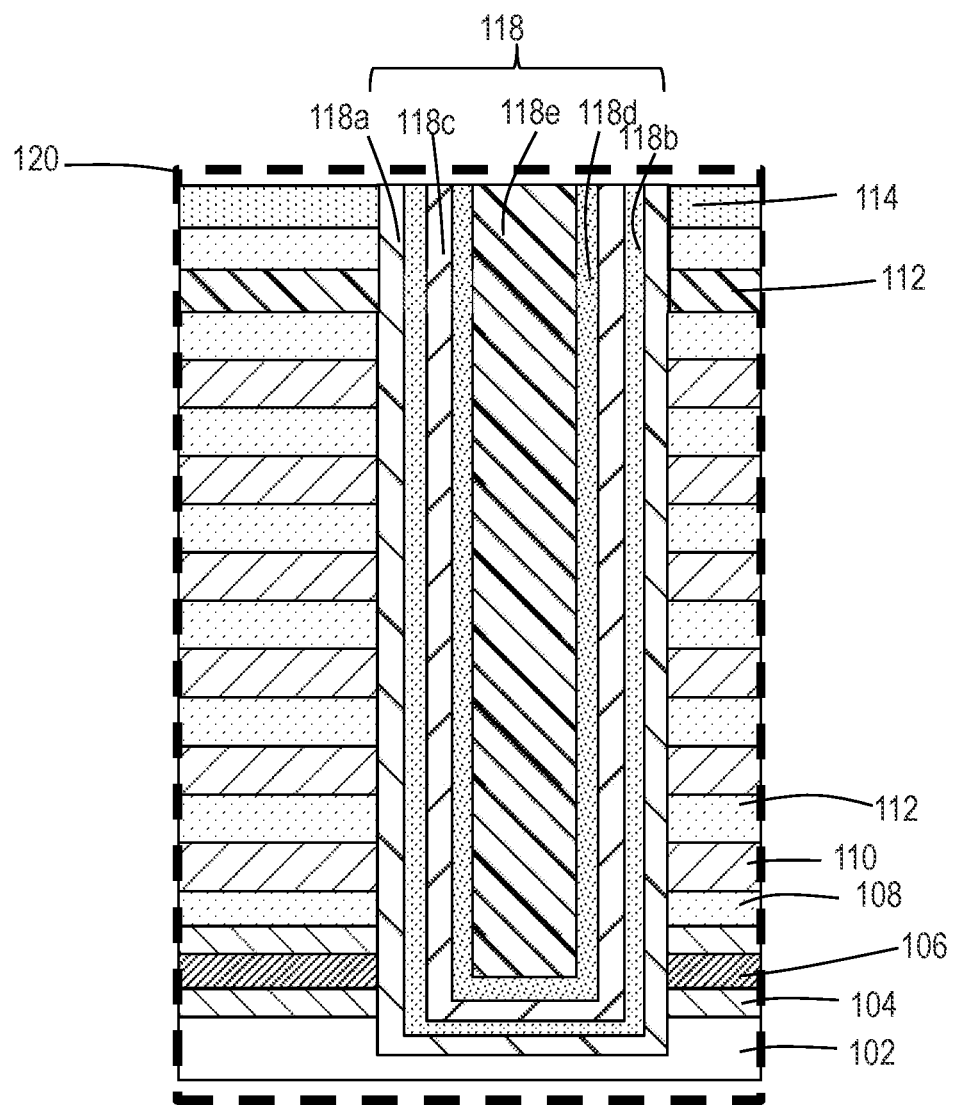
FIG. 5B illustrates an expanded view of region 120 according to one or more embodiments.

FIGS. 4-5B illustrate the formation of a memory string through the memory stack 130. With reference to FIG. 4, at operation 30 a memory hole channel 116 is opened/patterned through the memory stack 130. In some embodiments, opening the memory hole channel 116 comprises etching through the mask layer 114, memory stack 130, common source line 103, and into substrate 102. The memory hole channel 116 has sidewalls that extend through the memory stack 130 exposing surfaces 111 of the second layers 110 and surfaces 109 of the first layers 108.

The select-gate-for-drain gate material 112 has surfaces 113 exposed as sidewalls of the memory hole channel 116. The memory hole channel 116 extends a distance into the substrate 102 so that sidewall surfaces 109, 111, 113 and bottom 115 of the memory hole channel 116 are formed within the substrate 102. The bottom 114 of the memory hole channel 116 can be formed at any point within the thickness of the substrate 102. In some embodiments, the memory hole channel 116 extends a thickness into the substrate 102 in the range of from about 10% to about 90%, or in the range of from about 20% to about 80%, or in the range of from about 30% to about 70%, or in the range of from about 40% to about 60% of the thickness of the substrate 102. In some embodiments, the memory hole channel 116 extends a distance into the substrate 102 by greater than or equal to 10 nm. In some embodiments, the memory hole channel 116 extends from a top surface of the select-gate-for-drain (SGD) gate through the memory stack to a bottom surface of the substrate.

FIG. 5A shows operation 35 in which the transistor layers 118 are formed in the memory hole channel 116. The transistor layers 118 can be formed by any suitable technique known to the skilled artisan. In some embodiments, the transistor layers are formed by a conformal deposition process. In some embodiments, the transistor layers are formed by one or more of atomic layer deposition or chemical vapor deposition.

In one or more embodiments, the deposition of the transistor layers 118 is substantially conformal. As used herein, a layer which is "substantially conformal" refers to a layer where the thickness is about the same throughout (e.g., on the top, middle and bottom of sidewalls and on the bottom of the memory hole channel 116). A layer which is substantially conformal varies in thickness by less than or equal to about 5%, 2%, 1% or 0.5%. The transistor layers 118 in the memory hole may comprise one or more of an aluminum oxide (AlO) layer, a blocking oxide layer, a trap layer, a tunnel oxide layer, and a channel layer.

Referring to FIG. 5B, which is an expanded view of region 120 of FIG. 5A, in one or more embodiments, the transistor layers 118 comprises an aluminum oxide layer 118a, a blocking oxide layer 118b, a nitride trap layer 118c, a tunnel oxide layer 118d, and a channel material 118e in the memory hole channel 116. In one or more embodiments, the channel material 118e comprises poly-silicon. In one or more embodiments, the aluminum oxide layer 118a is deposited in the memory hole channel 116 on the sidewalls of the memory hole channel 116.

The transistor layers 118 can have any suitable thickness depending on, for example, the dimensions of the memory hole channel 116. In some embodiments, the transistor layers 118 have a thickness in the range of from about 0.5 nm to about 50 nm, or in the range of from about 0.75 nm to about 35 nm, or in the range of from about 1 nm to about 20 nm.

In one or more embodiments, the transistor layers 118 comprises one or more of a select-gate-for-drain (SGD) transistor or a memory transistor, and the transistor layers 118 independently comprise one or more transistor layers selected from aluminum oxide (AlO), a blocking oxide, a trap material, a tunnel oxide, and a channel layer/channel material.

In one or more embodiments, the at least one select-gate-for-drain (SGD) transistor further comprises a first gate dielectric and the at least one memory transistor comprises a second gate dielectric, the first gate dielectric and the second gate dielectric comprising the same material.

Figure 6A:
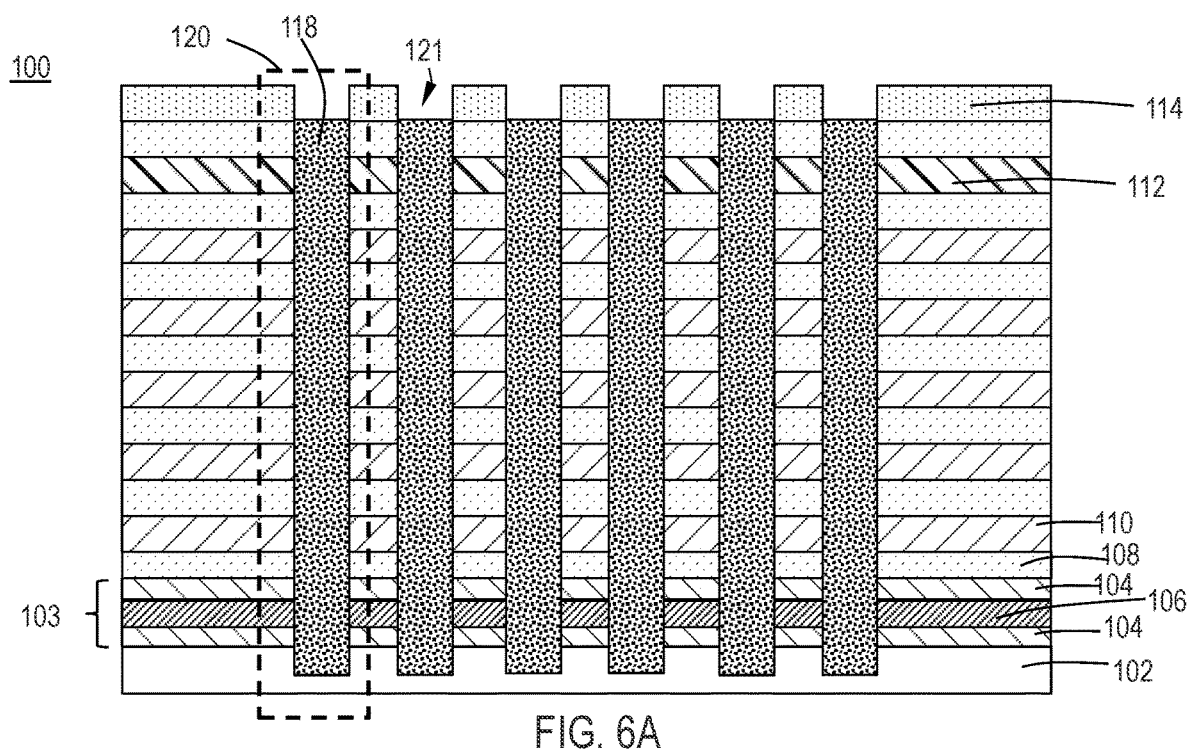
FIG. 6A illustrates a cross-sectional view of an electronic device according to one or more embodiments.
Figure 6B:
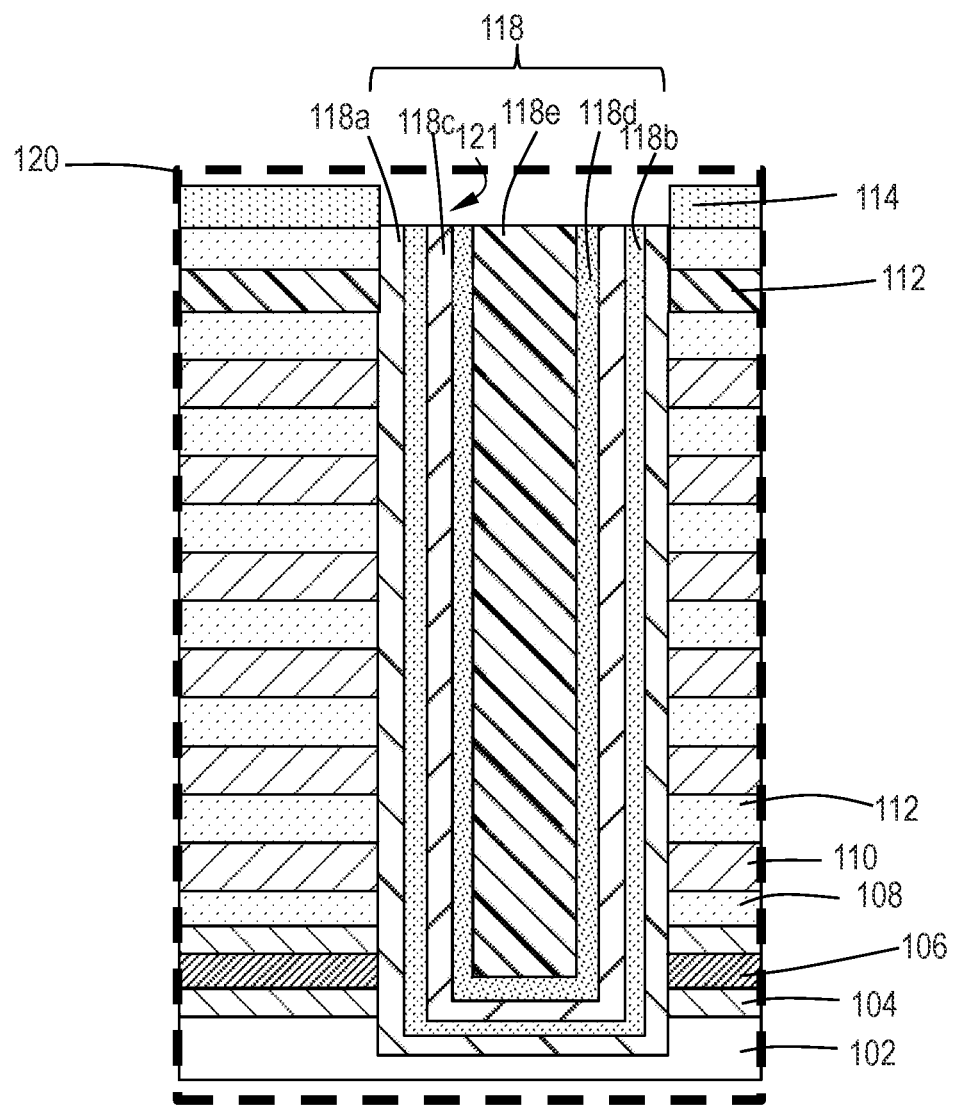
FIG. 6B illustrates an expanded view of region 120 according to one or more embodiments.
Figure 7A:
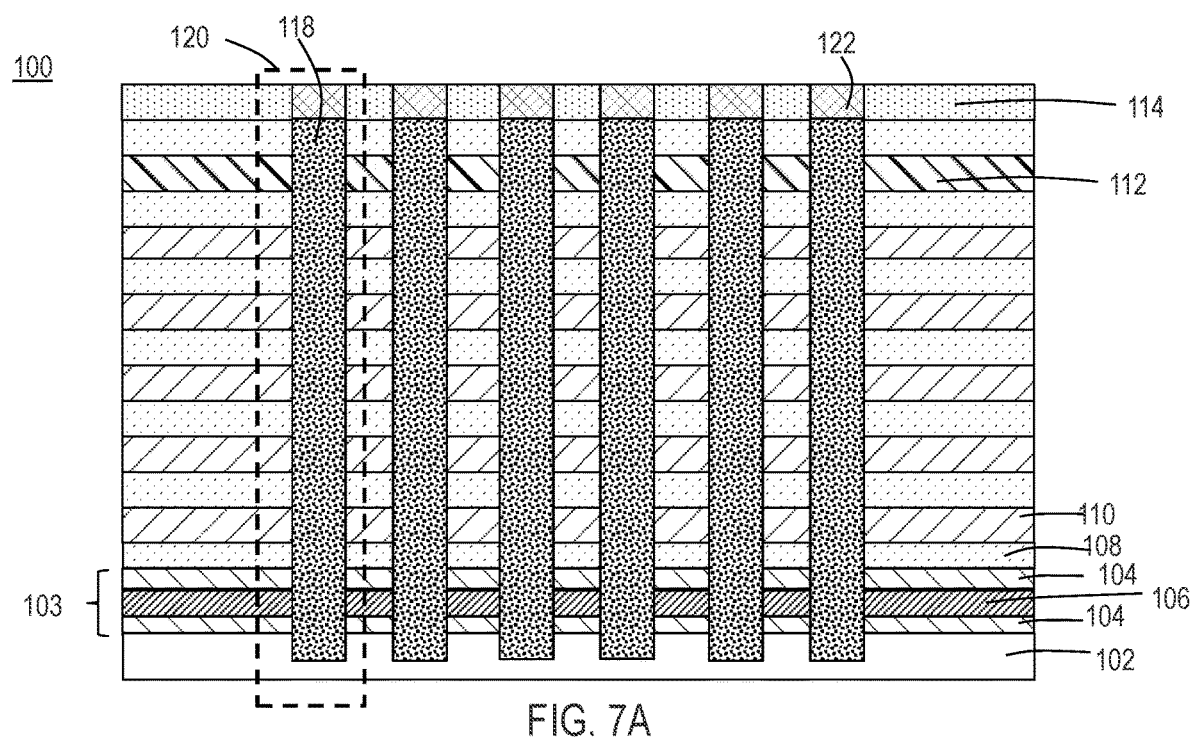
FIG. 7A illustrates a cross-sectional view of an electronic device according to one or more embodiments.
Figure 7B:
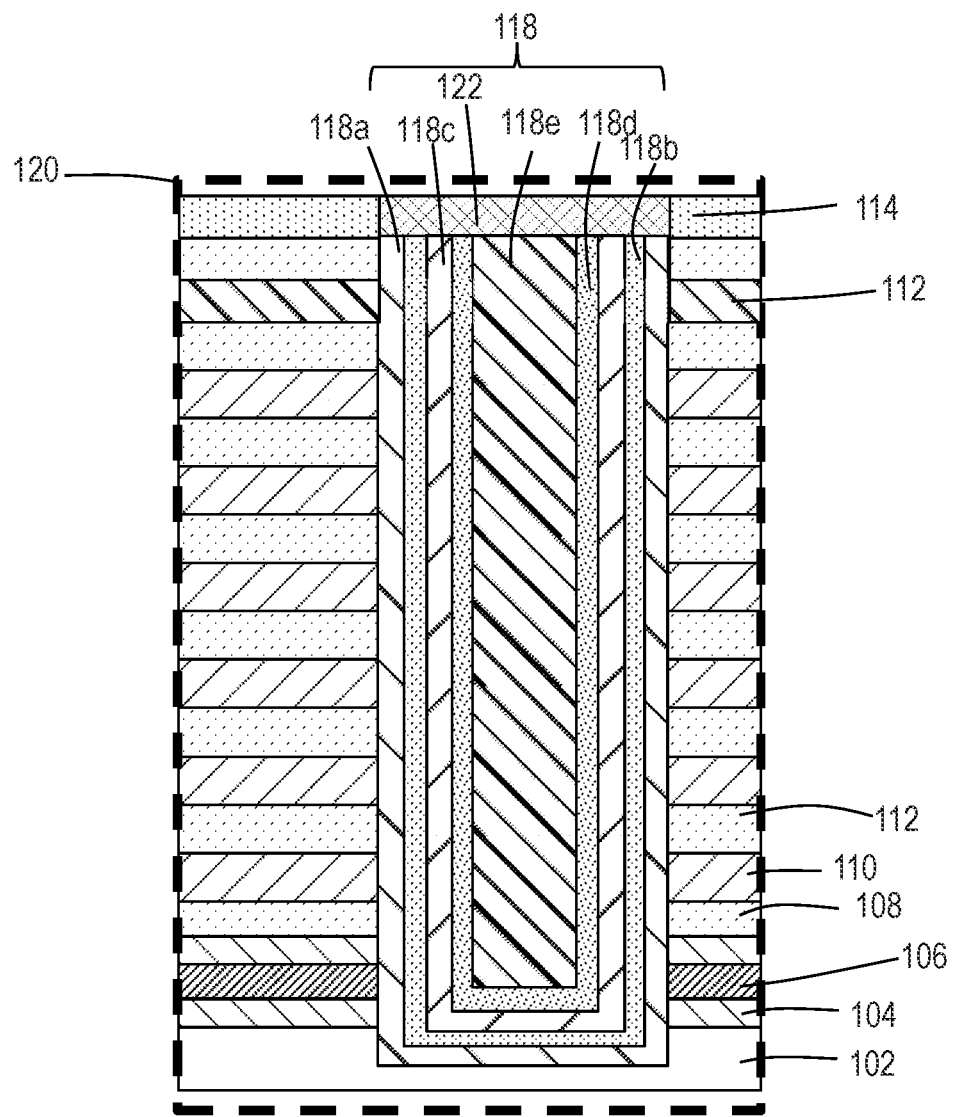
FIG. 7B an expanded view of region 120 according to one or more embodiments.
Figure 8:
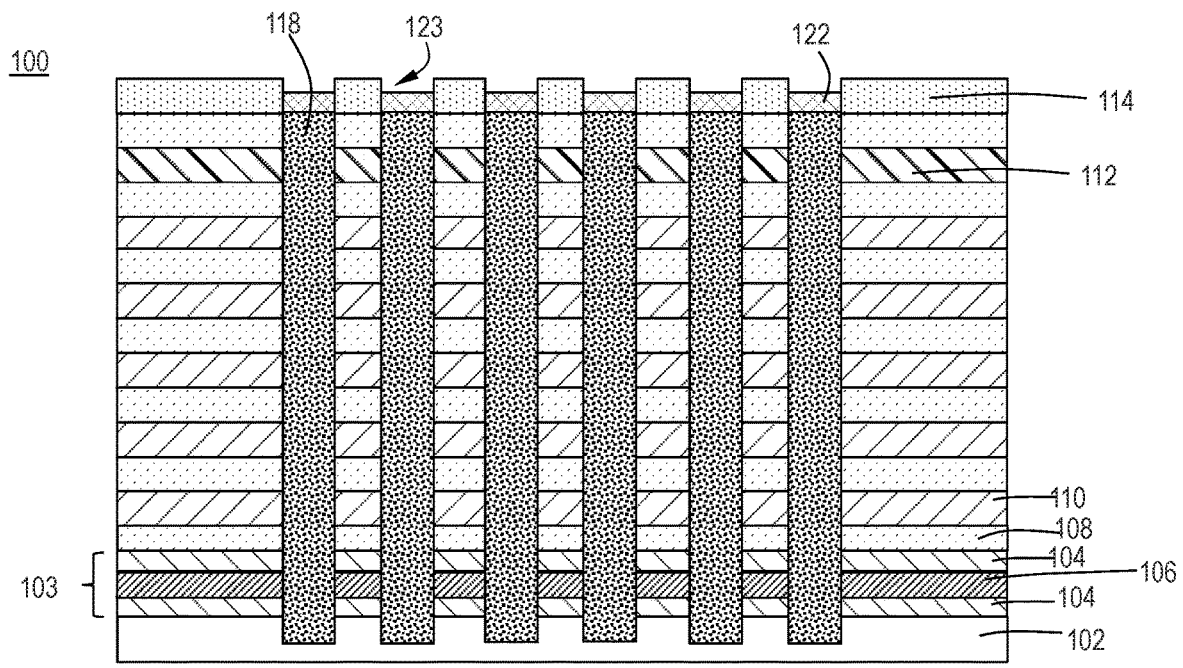
FIG. 8 illustrates a cross-sectional view of an electronic device according to one or more embodiments.

FIGS. 6A-7B show operation 40 of method 10 where a bit line pad 122 is formed on the top surface of the transistor layers 118 and in the mask layer 114. In one or more embodiments, the bit line pad 122 is formed on a drain side of the select-gate-for-drain (SGD) transistor. The bit line pad 122 can be any suitable material known to the skilled artisan including, but not limited to, poly-silicon. Referring to FIGS. 6A and 6B, the transistor layers 118 are etched back to form a recess 121. As illustrated in FIGS. 7A and 7B, the recess is then filled with a bit line pad 122.

Figure 9A:
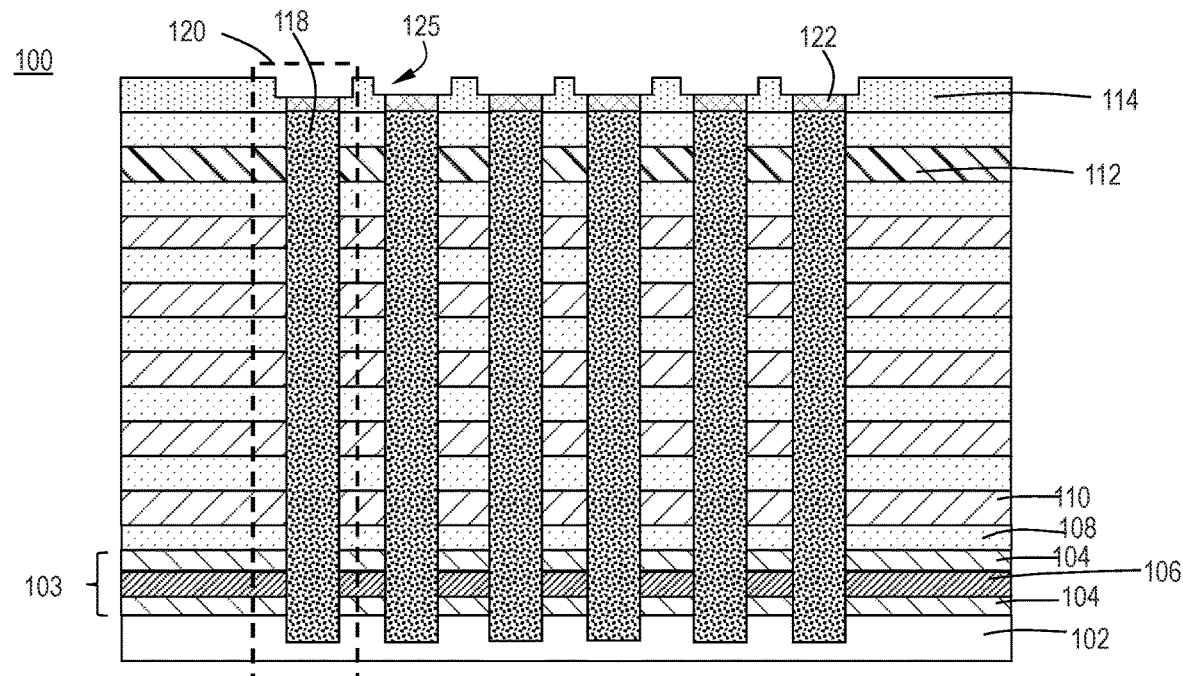
FIG. 9A illustrates a cross-sectional view of an electronic device according to one or more embodiments.
Figure 9B:
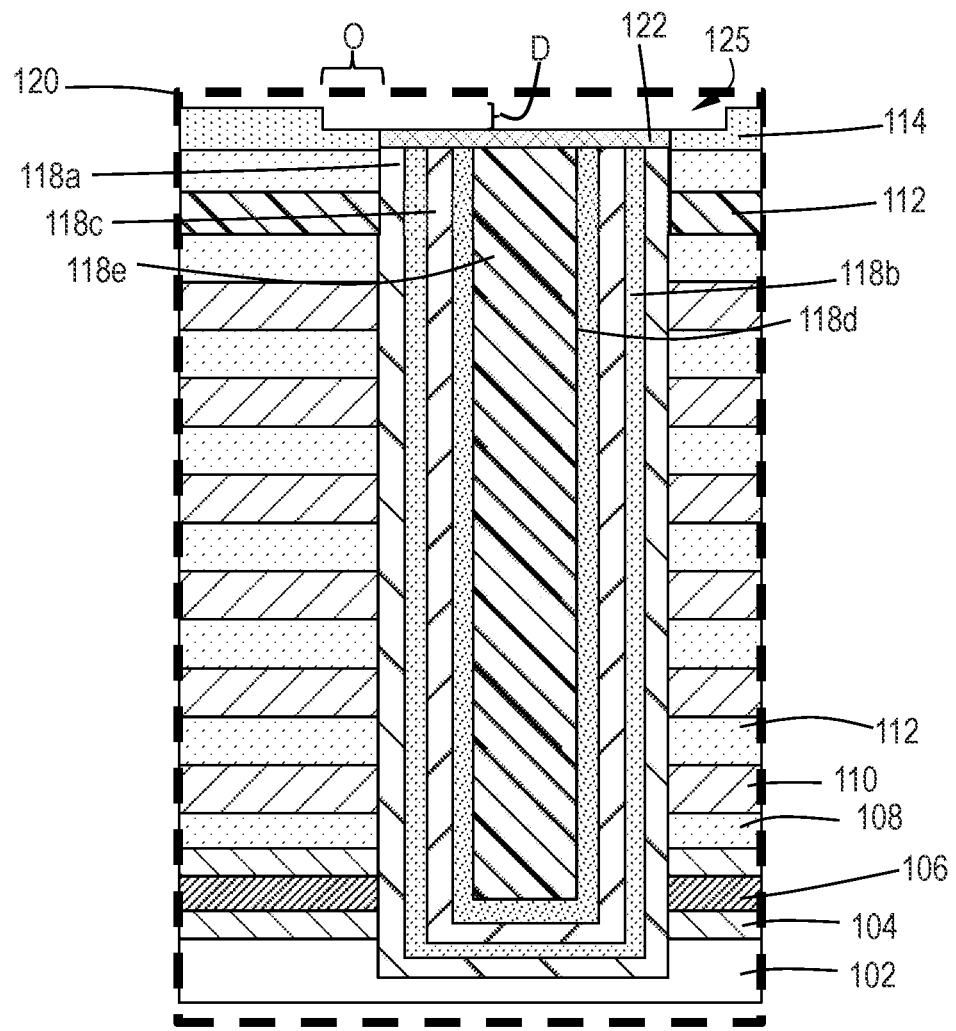
FIG. 9B illustrates an expanded view of region 120 according to one or more embodiments.

At operation 45 of method 10, the bit line pad 122 is recessed and a recess opening 123 is formed. The critical dimension of the recess opening 123 is then enlarged, as illustrated in FIGS. 9A and 9B, to form an enlarged recess opening 125. The enlarged recess opening 125 has a depth D and an overhang O. The overhang O is the distance from the edge of the bit line pad 122 to the edge of the enlarged recess opening 125. In one or more embodiments, the enlarged recess opening 125 has a depth D in a range of from 1 nm to 100 nm, or from 1 nm to 50 nm, or from 1 nm to 20 nm. In one or more embodiments, the overhang O amount is in a range of from 1 nm to 50 nm, or from 1 nm to 20 nm.

Figure 10A:
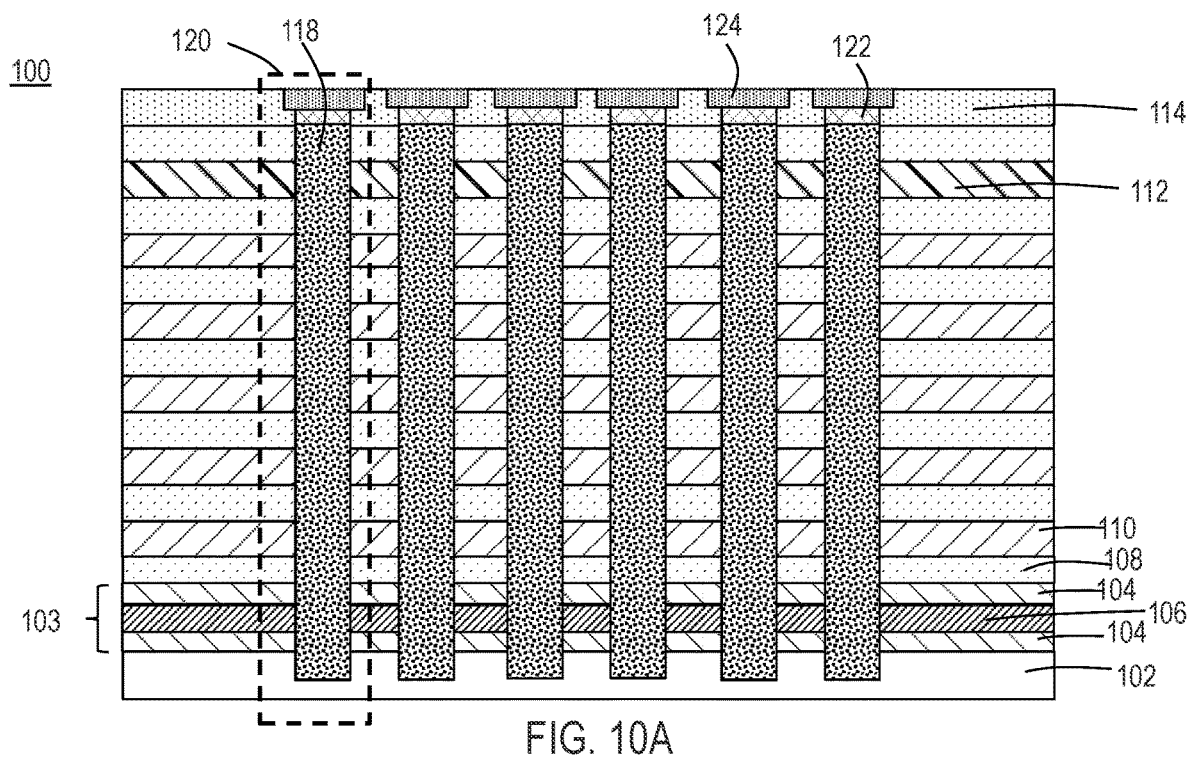
FIG. 10A illustrates a cross-sectional view of an electronic device according to one or more embodiments.
Figure 10B:
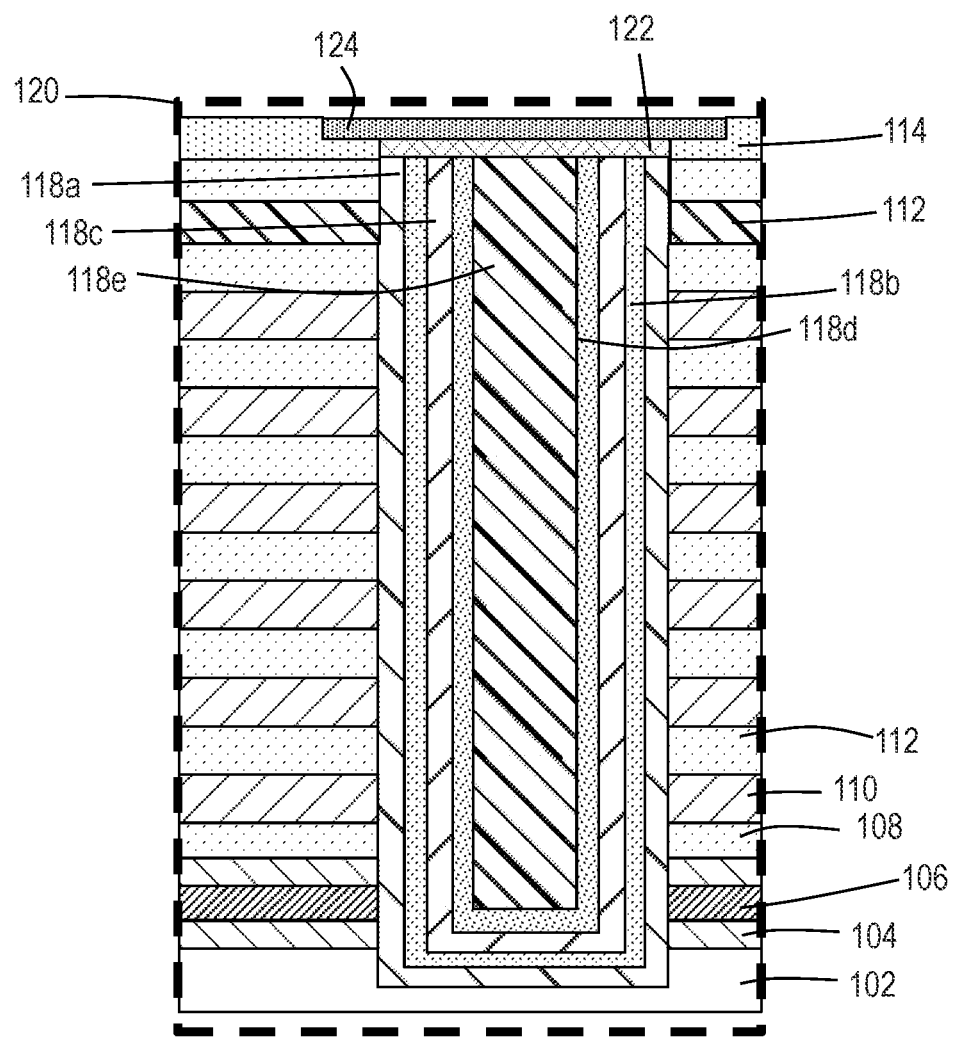
FIG. 10B illustrates an expanded view of region 120 according to one or more embodiments.

With reference to FIGS. 10A and 10B, at operation 50 of method 10, a self-aligned mask layer 124 is formed in the enlarged recess opening 125. In one or more embodiments, the self-aligned mask layer 124 has a thickness equal to the depth D of the enlarged recess opening 125, in a range of from 1 nm to 100 nm, or from 1 nm to 50 nm, or from 1 nm to 20 nm. In one or more embodiments, the self-aligned mask layer 124 has an overhang O amount equal to the overhang O amount of the enlarged recess opening 125 in a range of from 1 nm to 50 nm, or from 1 nm to 20 nm. The self-aligned mask layer 124 may comprise any suitable material known to the skilled artisan. In one or more embodiments, the self-aligned mask layer 124 may be selected from one or more silicon nitride (SiN), aluminum oxide (AlO), hafnium, oxide (HfO), refractory metal, refractory metal silicide, and refractory metal oxide.

Figure 10C:
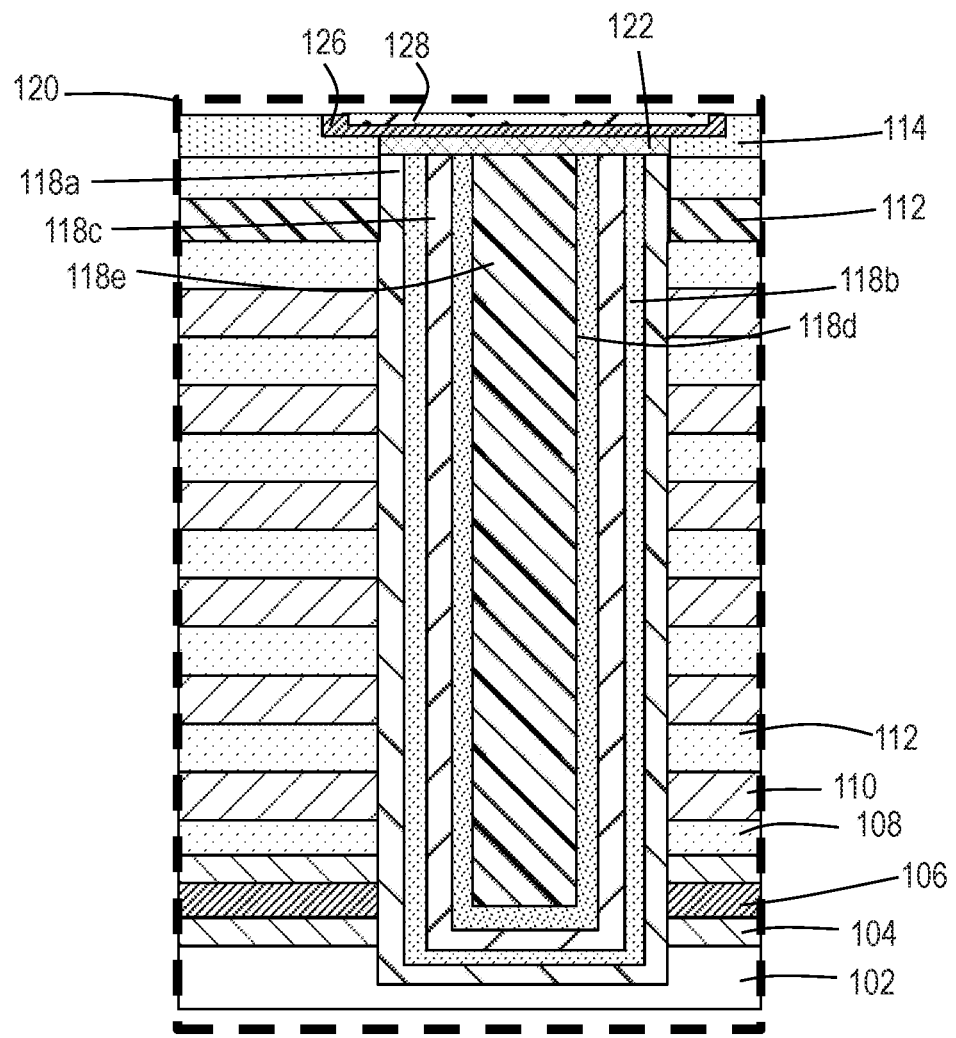
FIG. 10C illustrates an expanded view of region 120 according to one or more alternative embodiments.

Referring to FIG. 10C, in an alternative embodiment, the enlarged recess opening 125 is filled with a liner 126 and a metal 128. In one or more embodiments, the liner 126 and a metal 128 together have a thickness equal to the depth D of the enlarged recess opening 125, in a range of from 1 nm to 100 nm, or from 1 nm to 50 nm, or from 1 nm to 20 nm. In one or more embodiments, the liner 126 and a metal 128 together have an overhang O amount equal to the overhang O amount of the enlarged recess opening 125 in a range of from 1 nm to 50 nm, or from 1 nm to 20 nm. The liner 126 may comprise any suitable material known to the skilled artisan. In one or more embodiments, the liner may be selected from one or more of titanium nitride (TiN) or tantalum nitride (TaN). The metal 128 may comprise any suitable material known to the skilled artisan. In one or more embodiments, the metal 128 may be selected from one or more of tungsten (W), tungsten (W), molybdenum (Mo), Tantalum (Ta), ruthenium (Ru), platinum (Pt), and osmium (Os).

Figure 11:
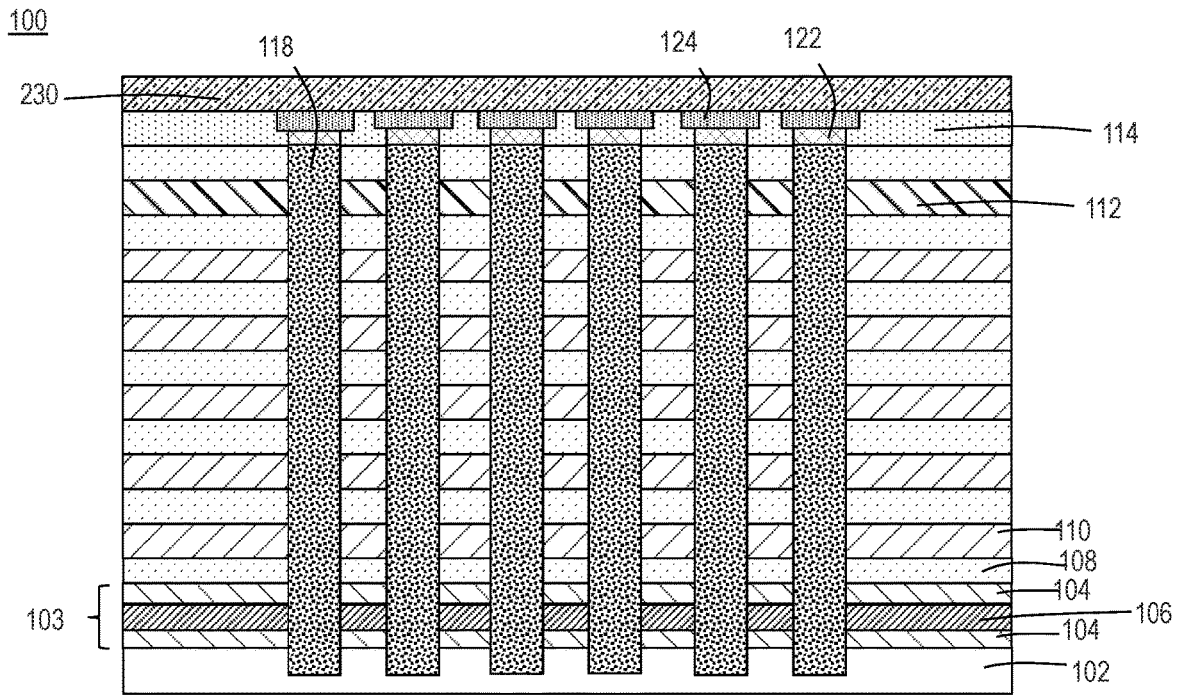
FIG. 11 illustrates a cross-sectional view of an electronic device according to one or more embodiments.

Referring to FIG. 11, a hard mask layer 230 is formed on a top surface of the mask layer 114 and the self-aligned mask 124. The hard mask layer 230 may comprise any suitable material known to the skilled artisan. In one or more embodiments, the hard mask layer 230 may be an amorphous carbon-based film.

Figure 12:
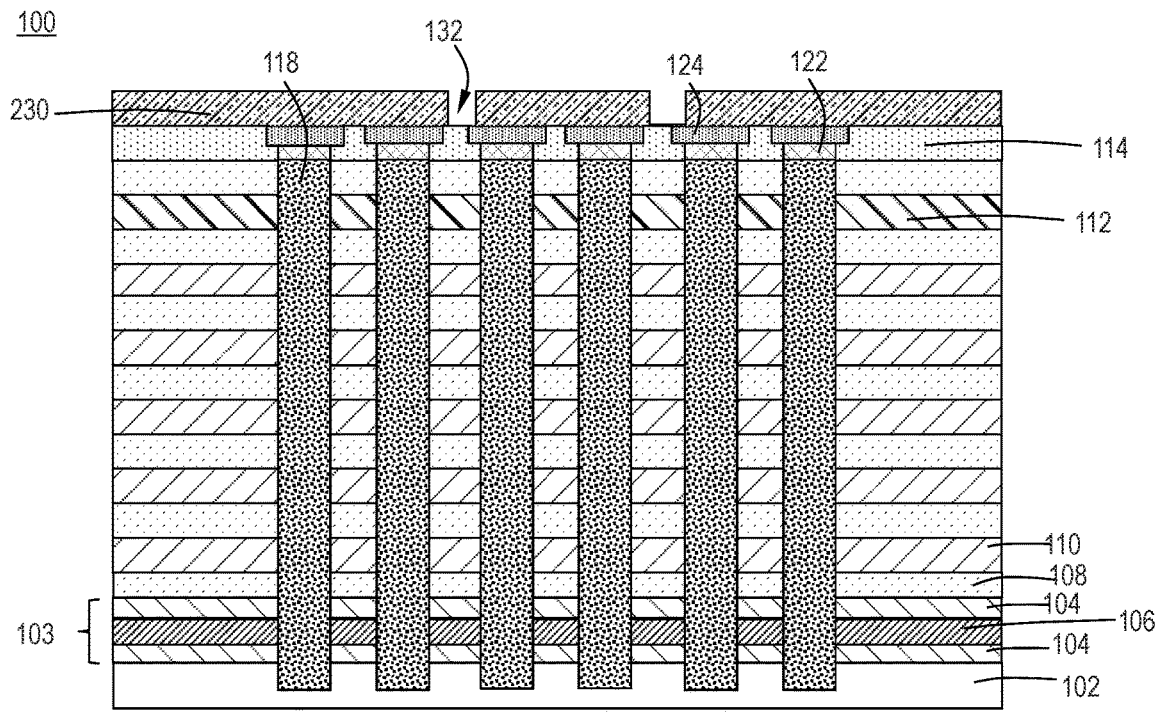
FIG. 12 illustrates a cross-sectional view of an electronic device according to one or more embodiments.

With reference to FIG. 12, the hard mask layer 230 is patterned to form an opening 132. The opening 132 extends from a top surface of the hard mask layer 230 to a top surface of the mask layer 114 and the self-aligned mask 124. The etching/patterning may be conducted by any suitable means known to the skilled artisan.

Figure 13A:
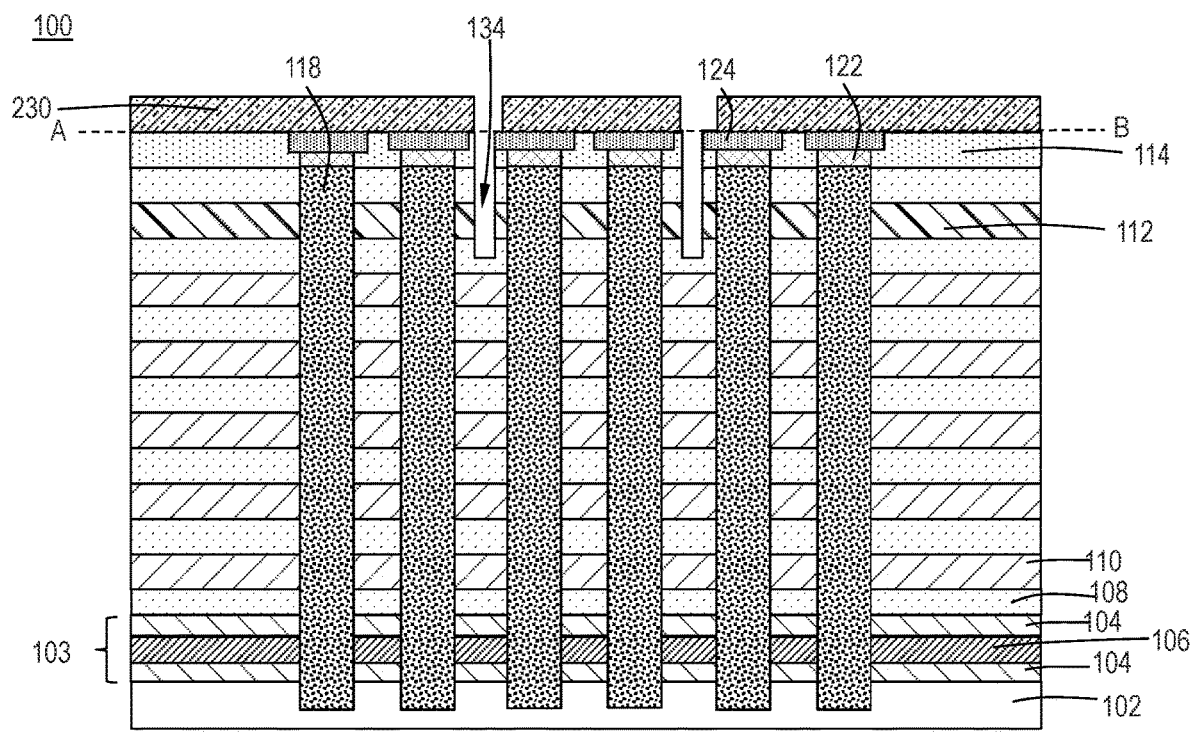
FIG. 13A illustrates a cross-sectional view of an electronic device according to one or more embodiments.
Figure 13B:
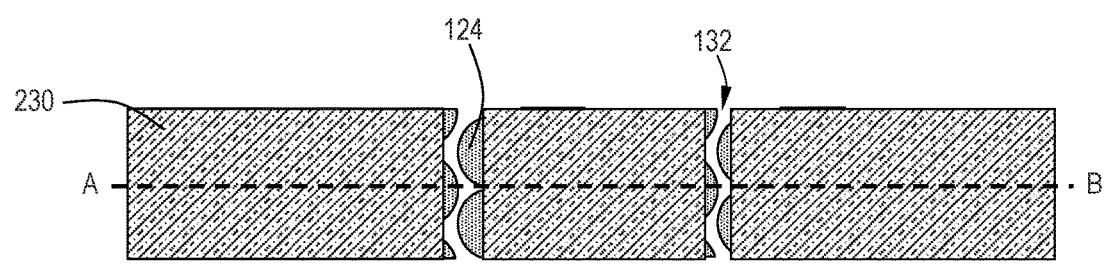
FIG. 13B illustrates a view along A-B according to one or more embodiments.

With reference to FIGS. 13A and 13B, at operation 55 of method 10, a select-gate-for-drain cut 134 is etched/cut into device. In some embodiments, this may be referred to as patterning a select-gate-for-drain cut (SGD). The select-gate-for-drain cut 134 extends from a top surface of the hard mask layer 230 through the select-gate-for-drain gate 112 to a first layer 108. The etching/patterning may be conducted by any suitable means known to the skilled artisan. In one or more embodiments, forming the select-gate-for-drain cut 134 comprises sequentially etching, e.g., by anisotropic dry etching, an oxide layer, and a select-gate-for-drain gate 112 material. FIG. 13B illustrates a view of the device taken along line A-B.

Figure 14A:
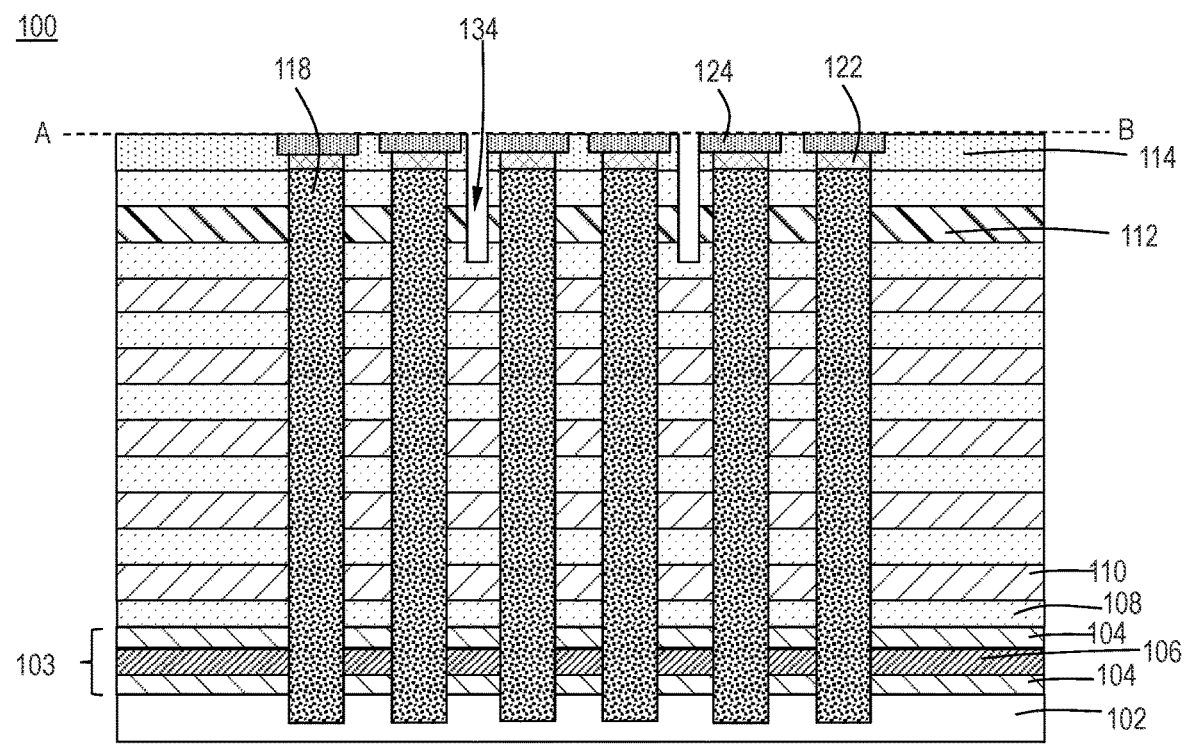
FIG. 14A illustrates a cross-sectional view of an electronic device according to one or more embodiments.
Figure 14B:
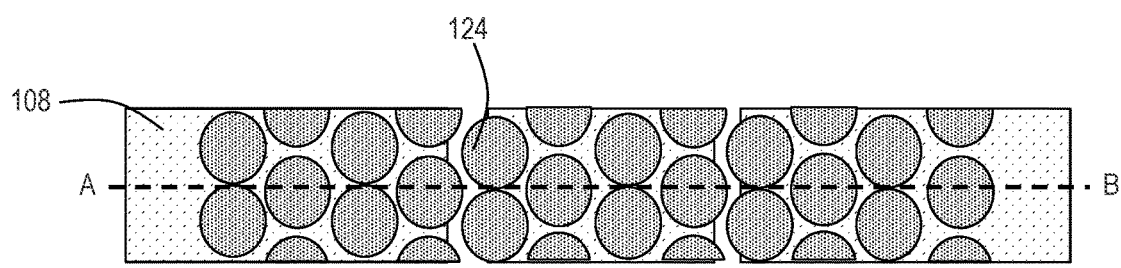
FIG. 14B illustrates a view along A-B according to one or more embodiments.

With reference to FIGS. 14A and 14B, the hard mask layer 230 is the removed. The hard mask layer 230 may be removed by any suitable means known to the skilled artisan. In some embodiments, the hard mask layer is removed by one or more of ashing and stripping.

Figure 15A:
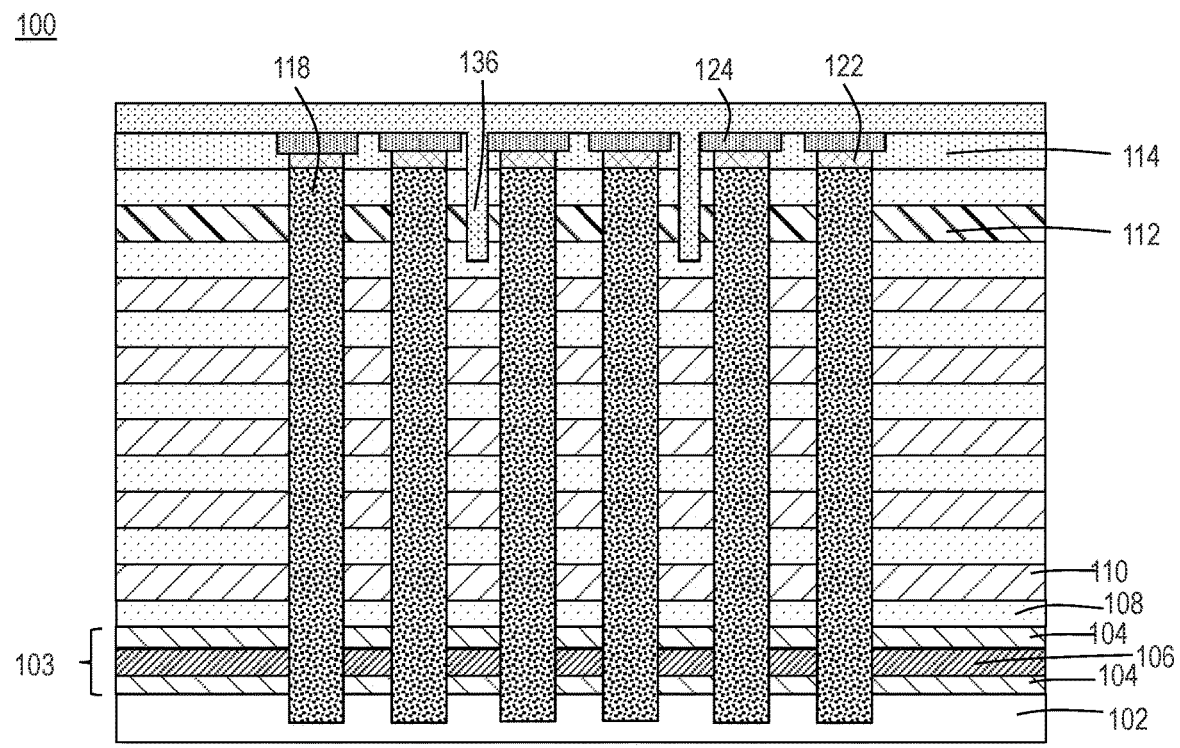
FIG. 15A illustrates a cross-sectional view of an electronic device according to one or more embodiments.
Figure 15B:
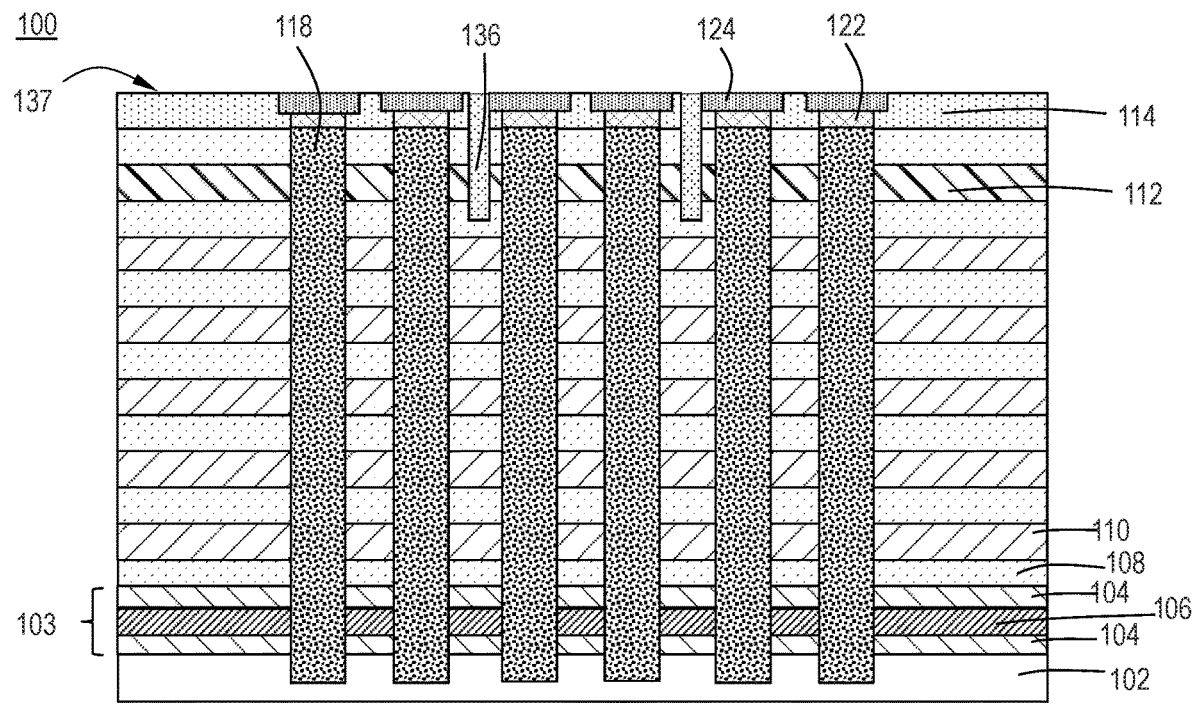
FIG. 15B illustrates a cross-sectional view of an electronic device according to one or more embodiments.

Referring to FIGS. 15A and 15B, a dielectric layer 136 is deposited on a top surface of the mask layer 114 and the self-aligned mask 124 to fill the select-gate-for-drain cut 134. The dielectric layer 136 may be deposited by any suitable technique known to one of skill in the art. The dielectric layer 136 may comprise any suitable material known to one of skill in the art. In one or more embodiments, the dielectric layer 136 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the dielectric layer 136, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, aluminum oxide, zirconium oxide, and the like. With reference to FIG. 15B, after deposition of the dielectric layer 136, the device is planarized to form a smooth and/or flat surface 137.

Figure 16:
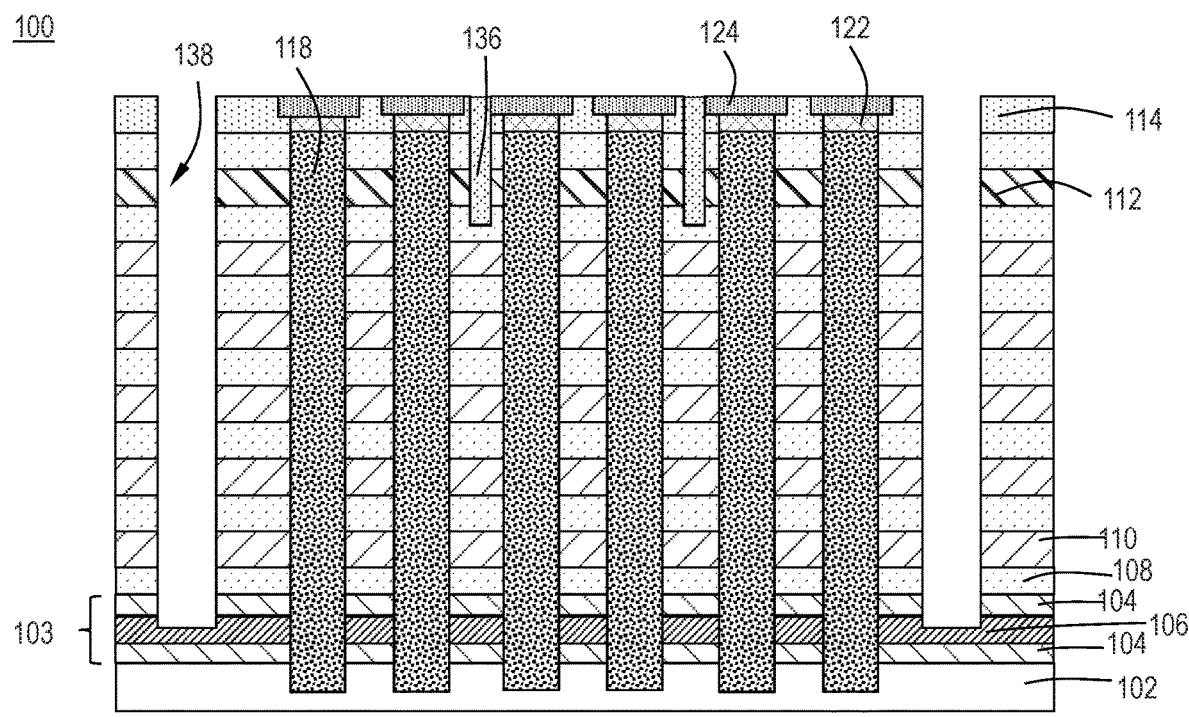
FIG. 16 illustrates a cross-sectional view of an electronic device according to one or more embodiments.

Referring to FIG. 16, at operation 65 of method 10, the memory stack 130 is slit patterned to form slit pattern openings 138 that extend from a top surface of the mask layer 114 to the sacrificial layer 106 of the common source line 103.

Figure 17A:
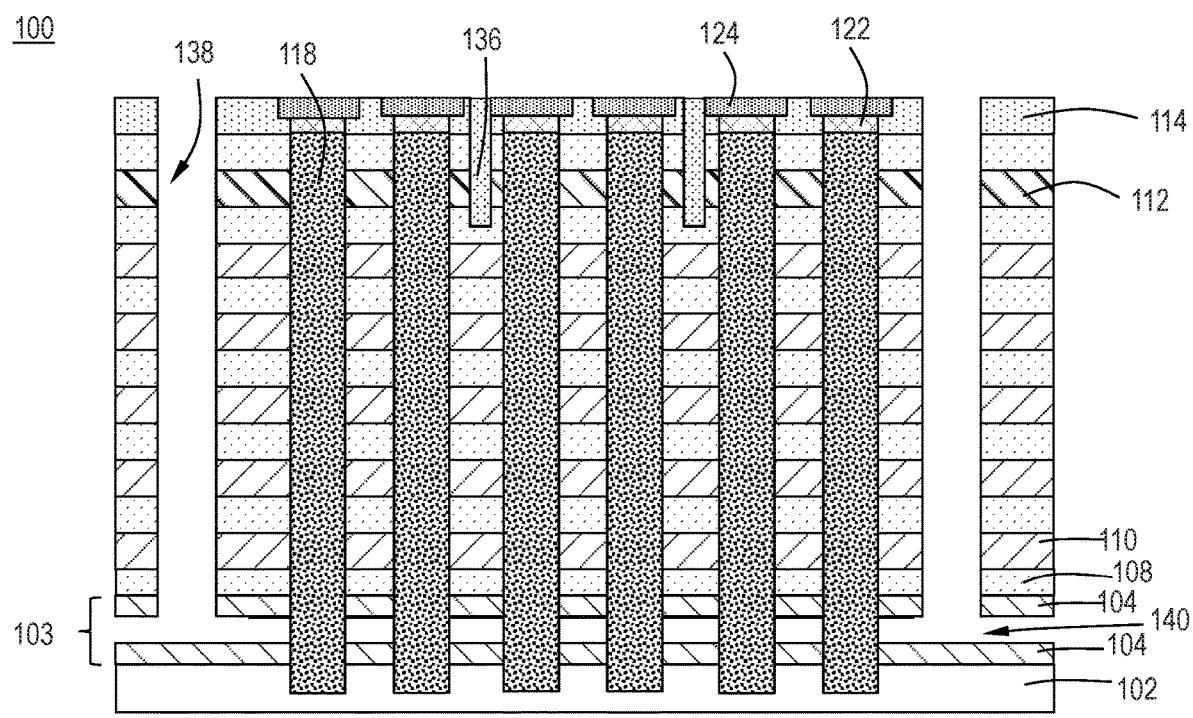
FIG. 17A illustrates a cross-sectional view of an electronic device according to one or more embodiments.
Figure 17B:
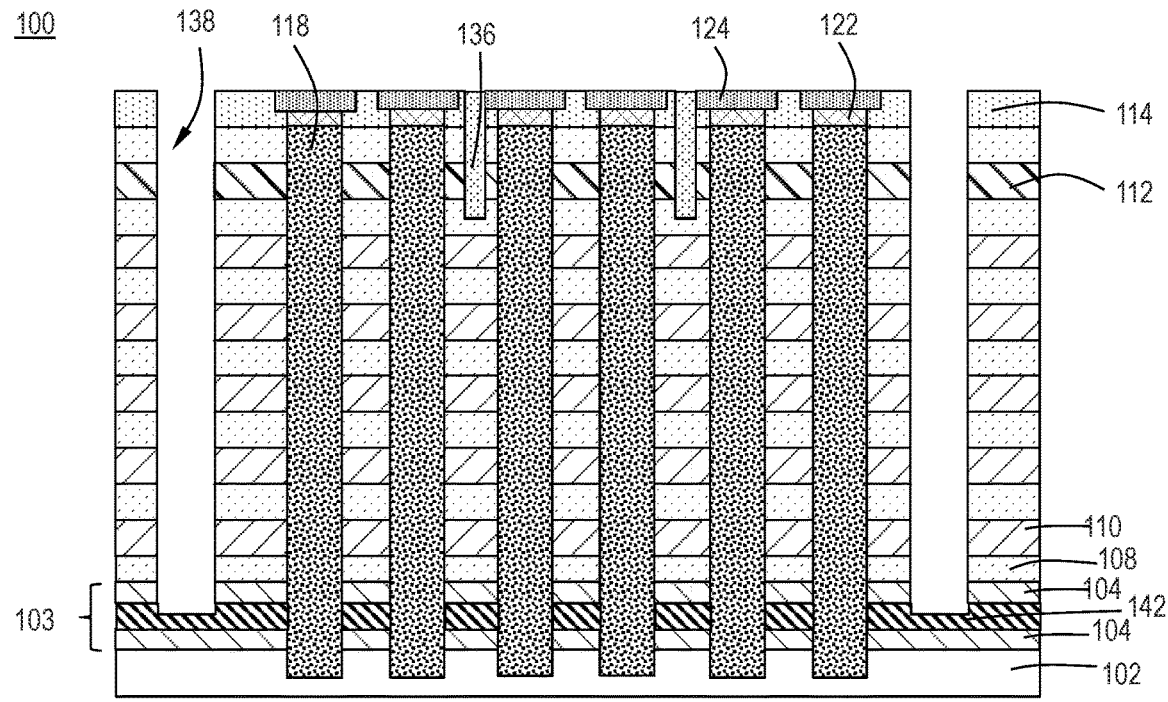
FIG. 17B illustrates a cross-sectional view of an electronic device according to one or more embodiments.

Referring to FIGS. 17A and 17B, shows operation 70 of method 10 where the sacrificial layer 106 in the common source line 103 is removed to form opening 140 and replaced with a poly-silicon layer 142. The sacrificial layer 106 can be removed by any suitable technique known to the skilled artisan including, but not limited to, selective etching, hot phosphoric acid, and the like. The poly-silicon layer 186 may be doped or undoped.

Figure 18:
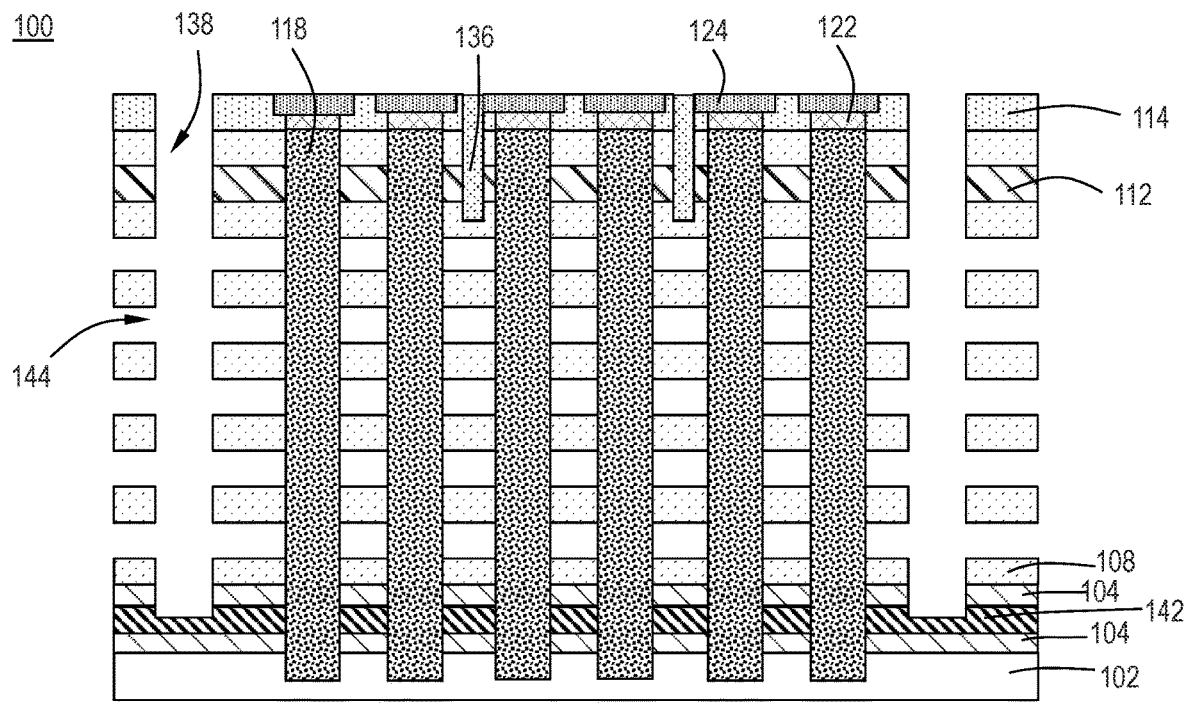
FIG. 18 illustrates a cross-sectional view of an electronic device according to one or more embodiments.

FIG. 18 illustrates where the second layers 110 are removed and word lines are formed. The second layers 110 may be removed by any suitable means known to the skilled artisan. In one or more embodiments, the second layers 110 are removed by selective etching, e.g., selective wet etching or selective dry etching. Removal of the second layers 110 forms opening 144.

Figure 19A:
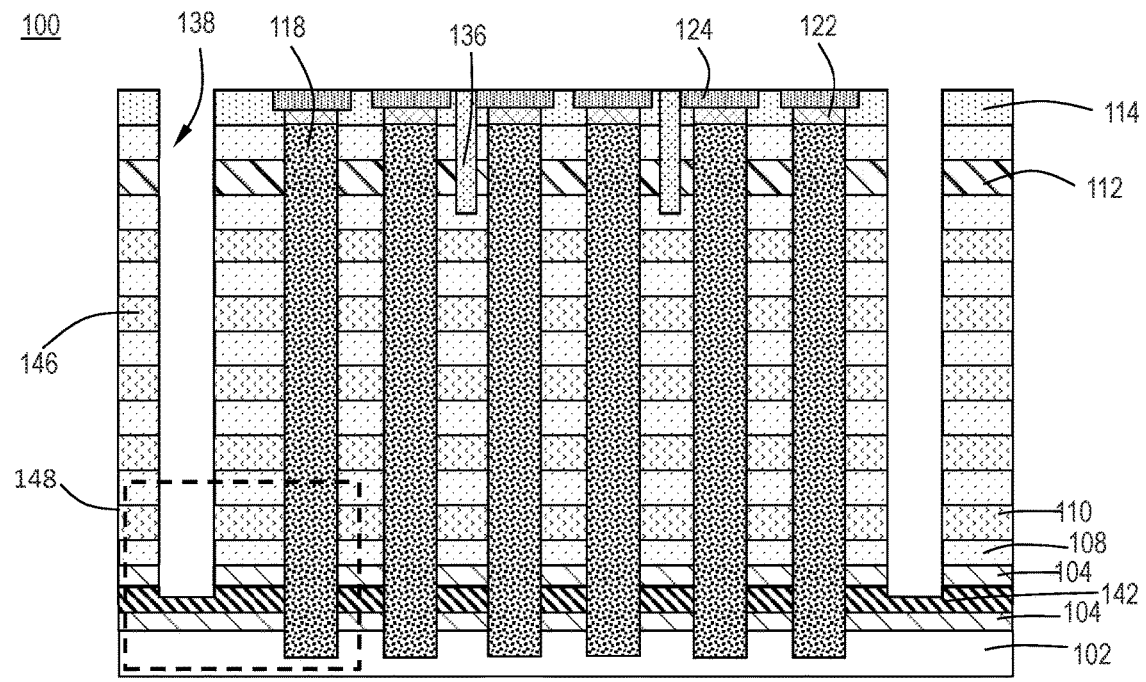
FIG. 19A illustrates a cross-sectional view of an electronic device according to one or more embodiments.
Figure 19B:
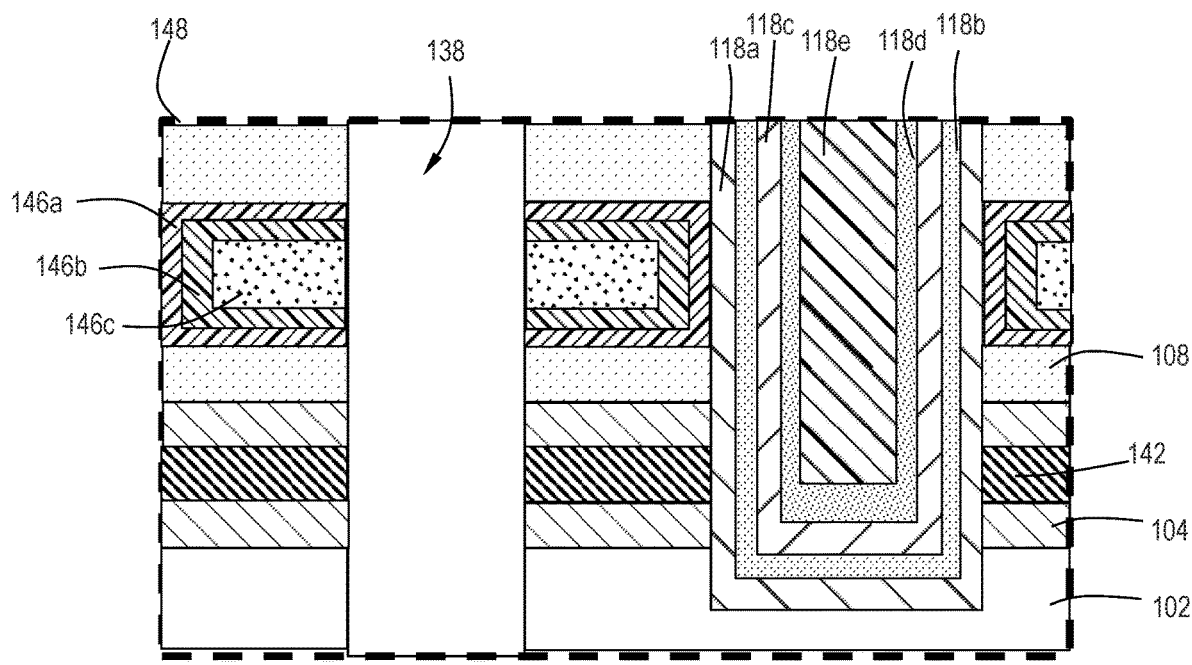
FIG. 19B illustrates an expanded view of region 148 according to one or more embodiments.

FIGS. 19A and 19B, show operation 75 of method 10, where the word lines 146 are formed. FIG. 19B is an enlarged view of area 148 of FIG. 19A. The word lines 146 comprise one or more of an oxide layer 146a, a barrier layer 146b, and a word line metal 146c. The oxide layer 146a may comprise any suitable material known to the skilled artisan. In one or more embodiments, the oxide layer 146a is an aluminum oxide layer. The barrier layer 146b may comprise any suitable material known to the skilled artisan. In one or more embodiments, the barrier layer 146b comprises one or more of titanium nitride (TiN), tantalum nitride (TaN), or the like. In one or more embodiments, the word line metal 146c comprises a bulk metal comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the word line metal 146c comprises tungsten (W). In other embodiments, the word line metal 146c comprises ruthenium (Ru). In one or more embodiments, the word lines 146 comprise one or more of a metal, a metal nitride, a conductive metal compound, and a semiconductor material. The metal may be selected from one or more of tungsten (W), molybdenum (Mo), tantalum (Ta), niobium (Nb), osmium (Os), zirconium (Zr), iridium (Ir), rhenium (Re), or titanium (Ti). The metal nitride may be selected from one or more of titanium nitride (TiN), tantalum nitride (TaN), tungsten nitride (WN), molybdenum nitride (MoN), and zirconium nitride (ZrN). The conductive metal compound may be selected from one or more of tungsten oxide (WOx), ruthenium oxide (RuOx), and iridium oxide (IrOx). The semiconductor material may be selected from one or more of silicon (Si), silicon germanium (SiGe), and germanium (Ge).

Figure 20:
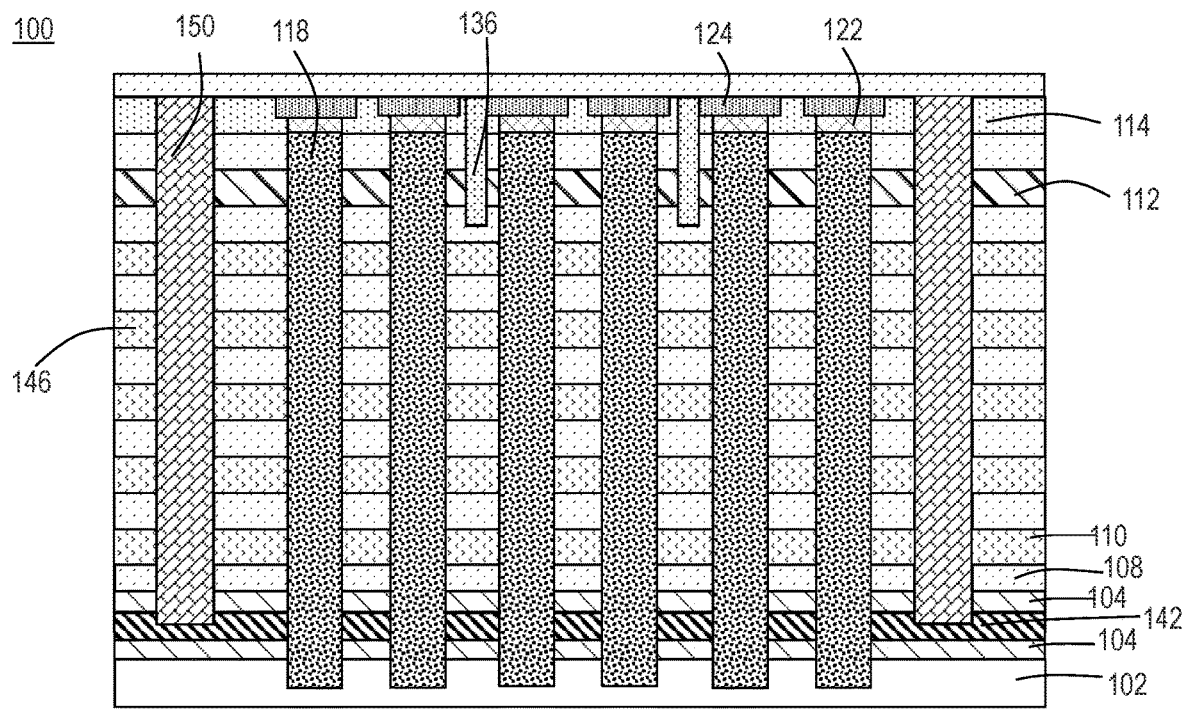
FIG. 20 illustrates a cross-sectional view of an electronic device according to one or more embodiments.

FIG. 20 shows operation 80 of method 10, where the slit 138 is filled with an insulator material 150. The insulator material 150 may be any suitable material known to the skilled artisan. In one or more embodiments, the filled slit 138 comprises an insulator material 150 selected from one or more of silicon oxide, silicon nitride, and silicon oxynitride. In one or more embodiments, the insulator material 150 is silicon oxide.

Figure 21:
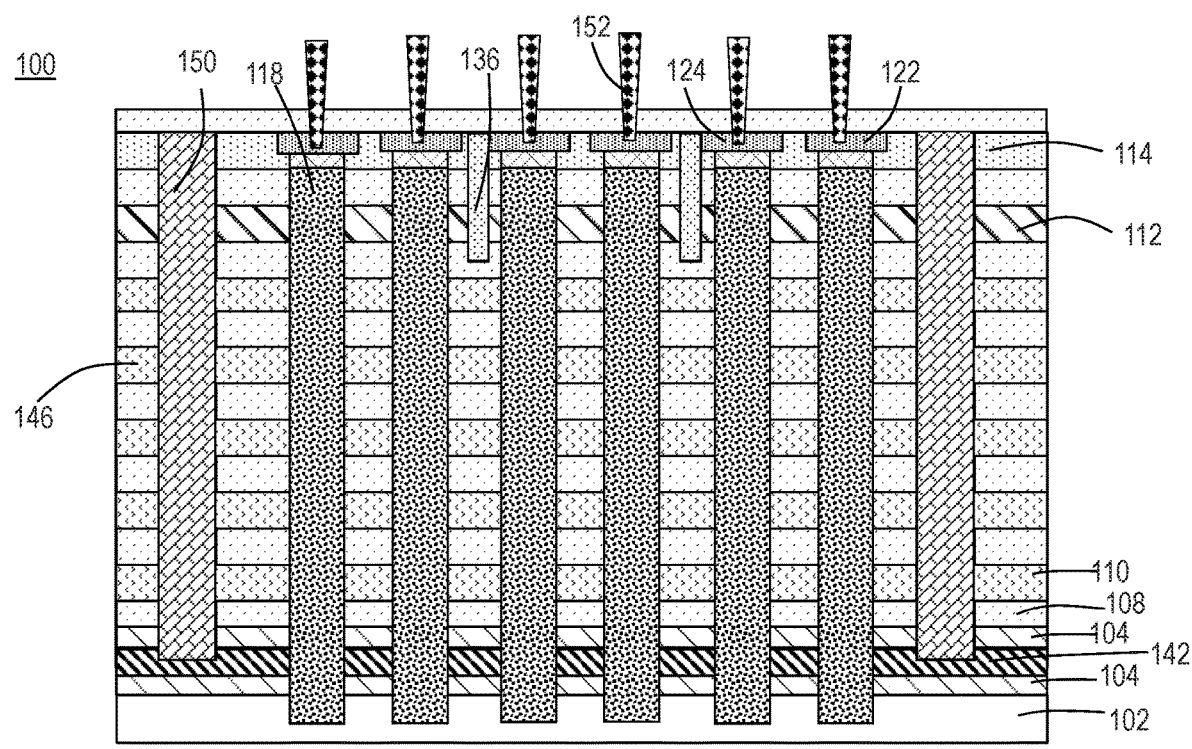
FIG. 21 illustrates a cross-sectional view of an electronic device according to one or more embodiments.

FIG. 21 shows operation 85 of method 10, wherein bit line pad studs 152 are formed. The bit line studs 152 may be formed by any suitable means known to the skilled artisan.

Figure 22:
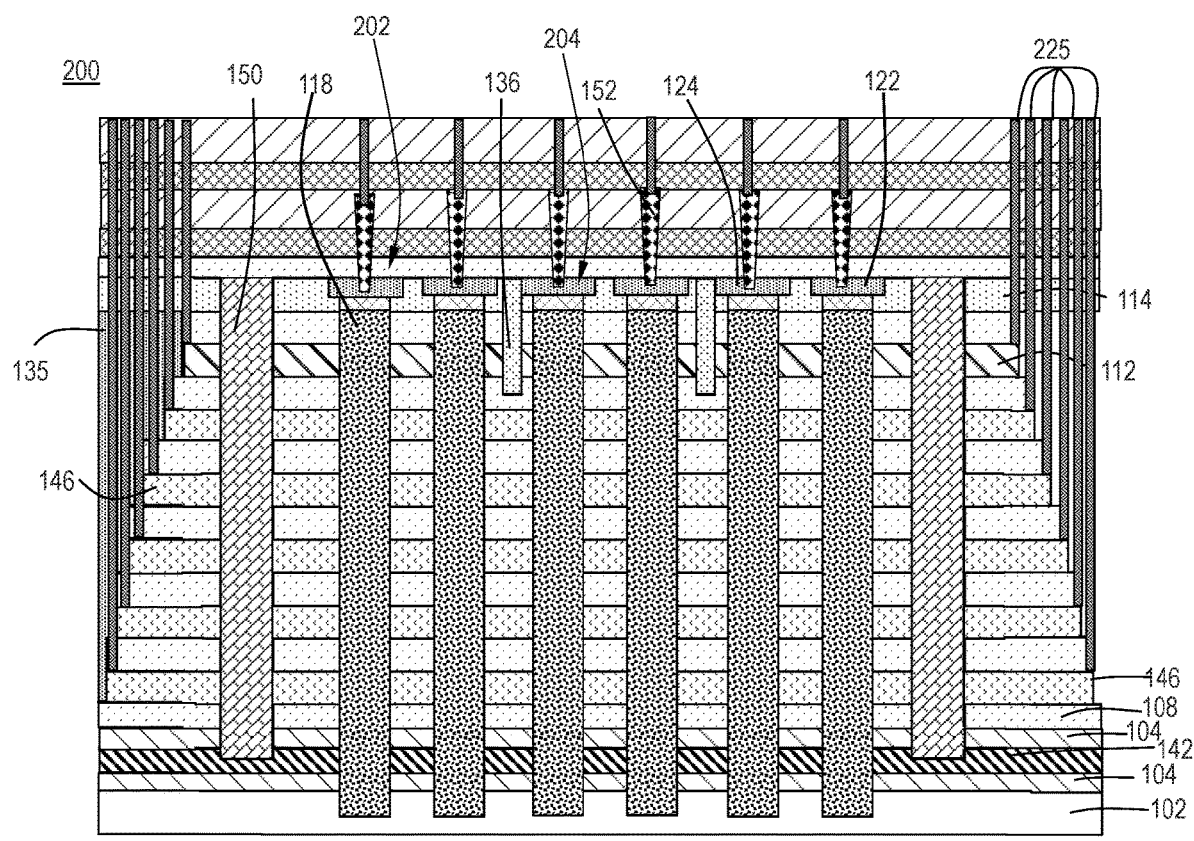
FIG. 22 illustrates a cross-sectional view of an electronic device according to one or more embodiments.

FIG. 22 shows operation 90 of method 10 where the word line (W/L) contacts are formed. The word line contacts 225 extend through the memory stack 130 a distance sufficient to terminate at one of the word lines. In one or more embodiments, the word line contacts 225 can comprise any suitable material known to the skilled artisan. In one or more embodiments, the word line contacts 225 comprises one or more of a metal, a metal silicide, poly-silicon, amorphous silicon, or EPI silicon. In one or more embodiments, the word line contact 225 is doped by either N type dopants or P type dopants in order to reduce contact resistance. In one or more embodiments, the metal of the word line contacts 225 are selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

Figure 23:
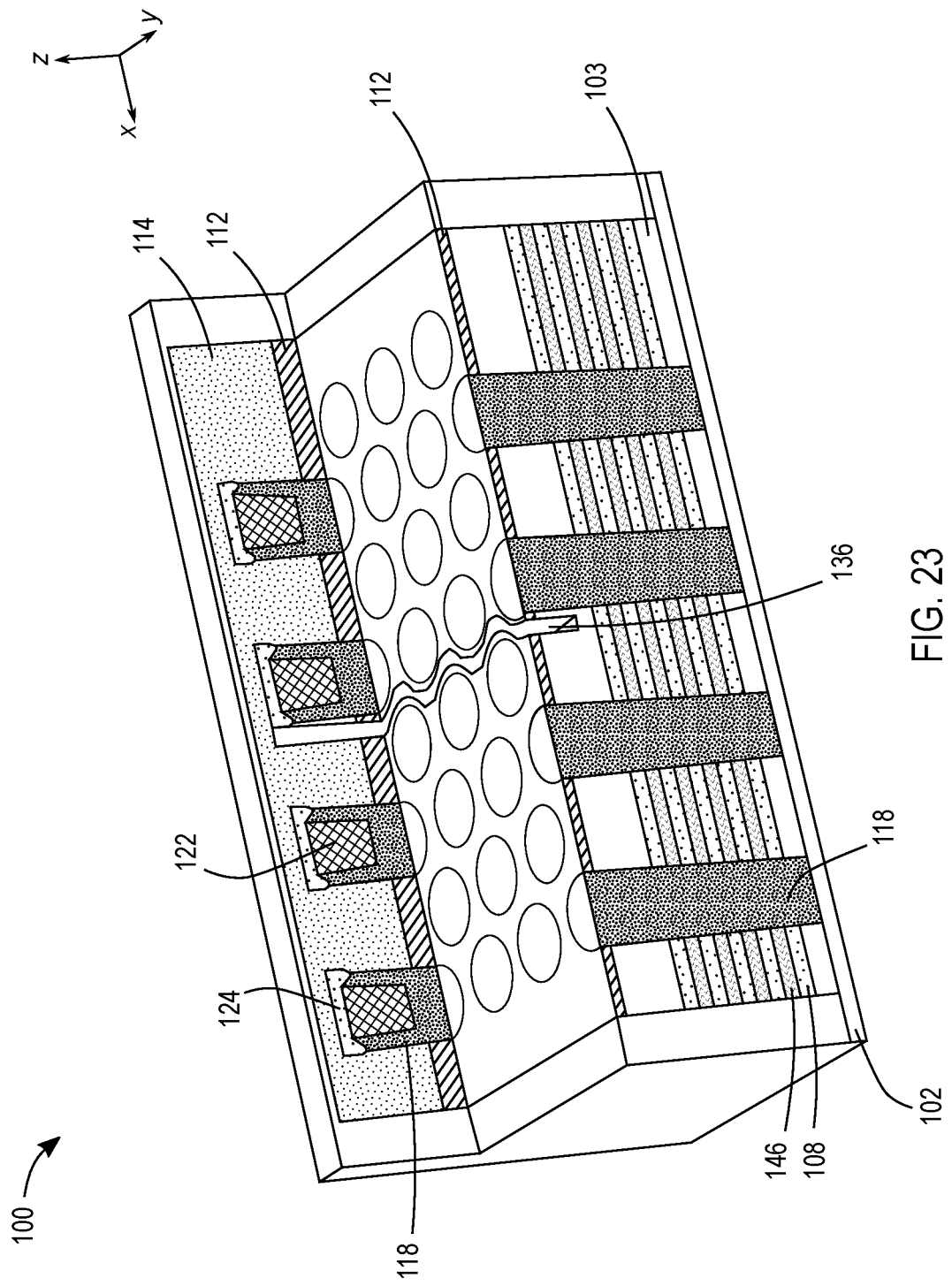
FIG. 23 illustrates a perspective view of an electronic device according to one or more embodiments.

FIG. 23 illustrates a perspective view of an electronic device 100 according to one or more embodiments. In one or more embodiments, a semiconductor memory device 100 comprises: at least one select-gate-for-drain (SGD) 112 on a memory stack 130 on a substrate 102, the memory stack 130 comprising alternating word line 146 and dielectric material (first layers 108); at least one select-gate-for-drain (SGD) transistor 202 in a first vertical hole extending through the memory stack, the select-gate-for-drain (SGD) transistor 202 comprising a first gate material 112; and at least one memory transistor 204 in a second vertical hole extending through the memory stack, the at least one memory transistor 204 comprising a second gate material 136 different from the first gate material 112. In some embodiments, the first gate material 112 comprises a gate-all-around (GAA) gate.

In other embodiments, a method of forming a semiconductor device is provided. The semiconductor device may have a three-dimensional vertical memory string including a select gate for drain (SGD) transistor and a memory transistor. In one or more embodiments, the method of forming a semiconductor device comprises forming a select-gate-for-drain (SGD) gate on a top surface of memory stack, the memory stack comprising alternating layers of a first layer and a second layer on a substrate; forming a memory string, the memory string extending through the select-gate-for-drain (SGD) gate and the memory stack; forming a bit line pad on a top surface of the memory string; forming a self-aligned mask on a top surface of the bit line pad; forming a first opening in the select-gate-for-drain (SGD) gate; filling the first opening with a dielectric material; forming a slit extending from a top surface of the select-gate-for-drain (SGD) gate through the memory stack to the substrate; removing the first layer to form a second opening; and forming a word line in the second opening.

Figure 24:
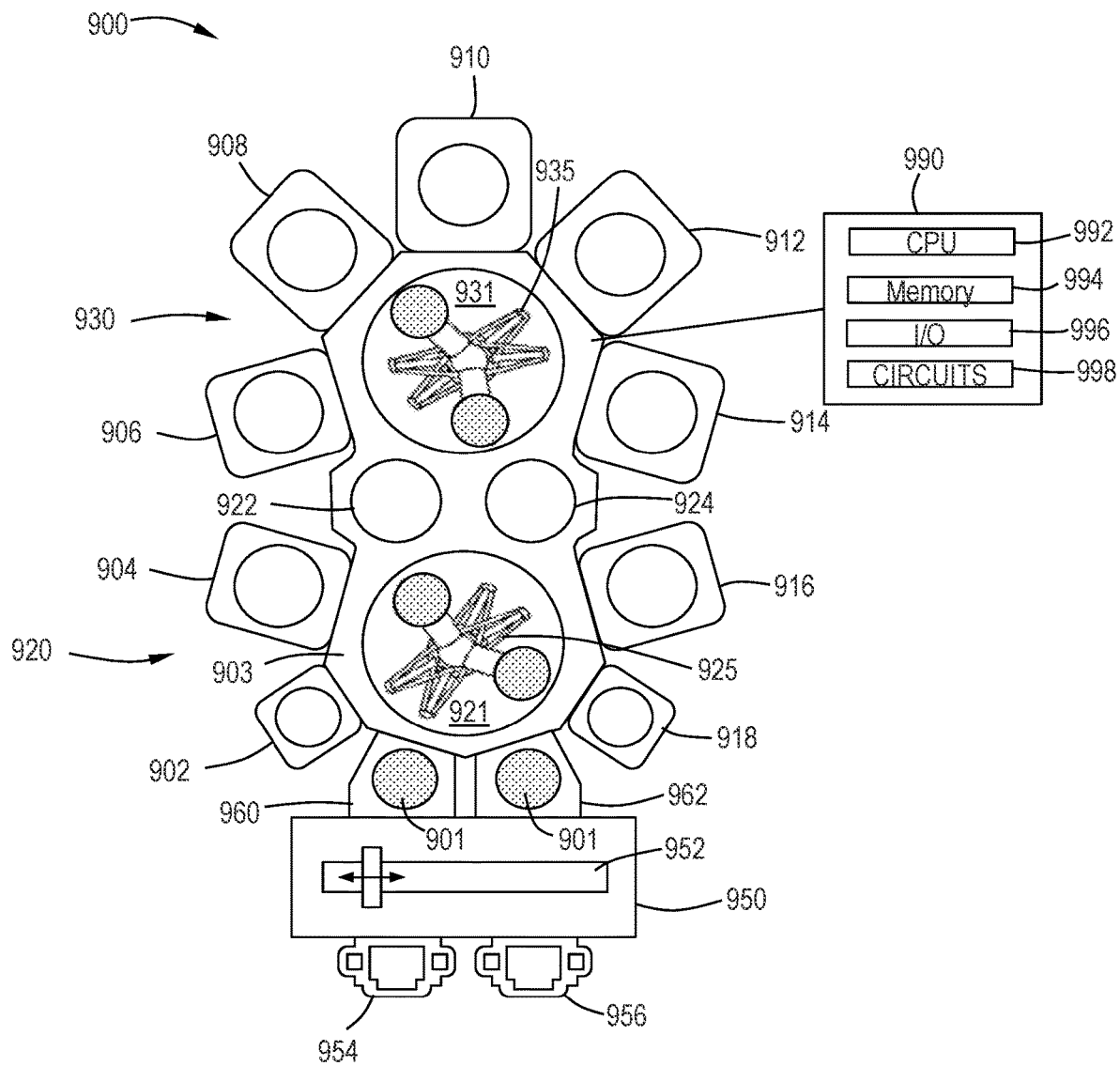
FIG. 24 illustrates a cluster tool according to one or more embodiments.

Additional embodiments of the disclosure are directed to processing tools 900 for the formation of the memory devices and methods described, as shown in FIG. 24.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective oxidation chamber, an oxide layer thinning chamber, or a word line deposition chamber. The particular arrangement of process chambers and components can be varied depending on the cluster tool and should not be taken as limiting the scope of the disclosure.

In some embodiments, the cluster tool 900 includes a selection-gate-for-drain (SGD) patterning chamber. The selection-gate-for-drain (SGD) patterning chamber of some embodiments comprises one or more selective etching chamber.

In the embodiment shown in FIG. 24, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a selection-gate-for-drain (SGD) patterning chamber; and a controller connected to the central transfer station and the plurality of process stations, the controller configured to activate the robot to move the wafer between process stations, and to control a process occurring in each of the process stations.

One or more embodiments provide a non-transitory computer readable medium including instructions, that, when executed by a controller of a processing chamber, causes the processing chamber to perform the operations of: form a first opening in a memory stack comprising alternating layers of a first layer and a second layer on a substrate; recess the second layer through the first opening to form a first recessed region; form a selection-gate-for-drain (SGD) isolation in the first opening and in the first recessed region; form a memory string formation through the memory stack; form a slit extending from a top surface of the memory stack to the substrate; remove the second layers to form a second opening; and fill the second opening and the slit with an insulating material.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A semiconductor memory device comprising:
   at least one select-gate-for-drain (SGD) on a memory stack on a substrate, the memory stack comprising alternating word line and dielectric material;
   at least one select-gate-for-drain (SGD) transistor in a first vertical hole extending through the memory stack, the select-gate-for-drain (SGD) transistor comprising a first gate material; and
   at least one memory transistor in a second vertical hole extending through the memory stack, the at least one memory transistor comprising a second gate material different from the first gate material.

2. The semiconductor memory device of claim 1, wherein the at least one select-gate-for-drain (SGD) transistor further comprises a first gate dielectric and the at least one memory transistor comprises a second gate dielectric, the first gate dielectric and the second gate dielectric comprising the same material.

3. The semiconductor memory device of claim 2, wherein the first gate material is a gate-all-around (GAA) gate.

4. The semiconductor memory device of claim 1, wherein the select-gate-for-drain (SGD) transistor and the memory transistor independently comprise one or more transistor layers selected from aluminum oxide (AlO), a blocking oxide, a trap material, a tunnel oxide, and a channel material.

5. The semiconductor memory device of claim 4, further comprising a bit line pad on a drain side of the select-gate-for-drain (SGD) transistor and a self-aligned mask on the bit line pad.

6. The semiconductor memory device of claim 5, wherein self-aligned mask comprises one or more of silicon nitride (SiN), aluminum oxide (AlO), hafnium, oxide (HfO), refractory metal, refractory metal silicide, refractory metal oxide, titanium nitride (TiN), tungsten (W), molybdenum (Mo), Tantalum (Ta), tantalum nitride (TaN), ruthenium (Ru), platinum (Pt), and osmium (Os).

7. The semiconductor memory device of claim 1, wherein the word line comprises one or more of a metal, a metal nitride, a conductive metal compound, and a semiconductor material.

8. The semiconductor memory device of claim 7, wherein the metal is selected from one or more of tungsten (W), molybdenum (Mo), tantalum (Ta), niobium (Nb), osmium (Os), zirconium (Zr), iridium (Ir), rhenium (Re), or titanium (Ti), wherein the metal nitride is selected from one or more of titanium nitride (TiN), tantalum nitride (TaN), tungsten nitride (WN), molybdenum nitride (MoN), and zirconium nitride (ZrN).

9. The semiconductor memory device of claim 7, wherein the conductive metal compound is selected from one or more of tungsten oxide (WOx), ruthenium oxide (RuOx), and iridium oxide (IrOx).

10. The semiconductor memory device of claim 7, wherein the semiconductor material is selected from one or more of silicon (Si), silicon germanium (SiGe), and germanium (Ge).

11. The semiconductor memory device of claim 1, further comprising at least one filled slit extending through the memory stack adjacent to the at least one select-gate-for-drain (SGD) transistor.

12. The semiconductor memory device of claim 11, wherein the filled slit comprises an insulator material selected from one or more of silicon oxide, silicon nitride, and silicon oxynitride.

13. The semiconductor memory device of claim 1, wherein the substrate is a common source line, the common source line comprising a sacrificial layer, an oxide layer, and a poly-silicon layer.

14. A semiconductor memory device comprising:
   at least one select-gate-for-drain (SGD) on a memory stack on a substrate, the memory stack comprising alternating word line and dielectric material;
   a vertical string extending through the memory stack, the vertical string comprising at least one SGD transistor and at least one memory transistor;
   a bit line pad on a top surface of the vertical string, the bit line pad having a first size; and
   a self-aligned mask layer on a top surface of the bit line pad, the self-aligned mask layer having a second size, the second size from 1 nm to 50 nm larger than the first size.

15. The semiconductor memory device of claim 14, wherein self-aligned mask comprises one or more of silicon nitride (SiN), aluminum oxide (AlO), hafnium, oxide (HfO), refractory metal, refractory metal silicide, refractory metal oxide, titanium nitride (TiN), tungsten (W), molybdenum (Mo), Tantalum (Ta), tantalum nitride (TaN), ruthenium (Ru), platinum (Pt), and osmium (Os).

16. A method of forming a semiconductor memory device having a three-dimensional vertical memory string including a select gate for drain (SGD) transistor and a memory transistor, the method comprising:
   forming a select-gate-for-drain (SGD) gate on a top surface of memory stack, the memory stack comprising alternating layers of a first layer and a second layer on a substrate;
   forming a memory string, the memory string extending through the select-gate-for-drain (SGD) gate and the memory stack;
   forming a bit line pad on a top surface of the memory string;

forming a self-aligned mask on a top surface of the bit line pad;
forming a first opening in the select-gate-for-drain (SGD) gate;
filling the first opening with a dielectric material;
forming a slit extending from a top surface of the select-gate-for-drain (SGD) gate through the memory stack to the substrate;
removing the first layer to form a second opening; and
forming a word line in the second opening.

17. The method of claim 16, wherein forming the memory string comprises:
patterning a memory hole extending from a top surface of the select-gate-for-drain (SGD) gate through the memory stack to a bottom surface of the substrate; and
depositing transistor layers in the memory hole, the transistor layers comprising one or more of an aluminum oxide (AlO) layer, a blocking oxide layer, a trap layer, a tunnel oxide layer, and a channel layer.

18. The method of claim 16, wherein the self-aligned mask has a thickness in a range of from 1 nm to 100 nm and wherein the self-aligned mask overhangs the bit line pad in an amount in a range of from 1 nm to 50 nm.

19. The method of claim 16, wherein the substrate is a common source line, the common source line comprising a sacrificial layer, an oxide layer, and a poly-silicon layer, and the method further comprises removing the sacrificial layer from the common source line to form a common source opening.

20. The method of claim 16, further comprising forming word line contacts.

* * * * *

UNITED STATES PATENT AND TRADEMARK OFFICE
CERTIFICATE OF CORRECTION

PATENT NO. : 12,148,475 B2  
APPLICATION NO. : 17/705744  
DATED : November 19, 2024  
INVENTOR(S) : Chang Seok Kang et al.

Page 1 of 1

It is certified that error appears in the above-identified patent and that said Letters Patent is hereby corrected as shown below:

In the Specification

•Column 1, Line 48, add "$\leq$" after "e.g.," and before "8, one SGD-cut".

•Column 1, Line 50, replace "12)" after "large, e.g.," and before ", SGD-cut needs" with "$\geq$ 12".

Signed and Sealed this  
Twenty-fifth Day of February, 2025

Coke Morgan Stewart  
*Acting Director of the United States Patent and Trademark Office*